United States Patent
Park et al.

(10) Patent No.: US 7,300,887 B2
(45) Date of Patent: Nov. 27, 2007

(54) METHODS OF FORMING METAL NITRIDE LAYERS, AND METHODS OF FORMING SEMICONDUCTOR STRUCTURES HAVING METAL NITRIDE LAYERS

(75) Inventors: Jae-Hwa Park, Gyeonggi-do (KR); Kwang-Jin Moon, Gyeonggi-do (KR); Gil-Heyun Choi, Seoul (KR); Sang-Woo Lee, Seoul (KR); Jeong-Tae Kim, Gyeonggi-do (KR); Jang-Hee Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 221 days.

(21) Appl. No.: 11/227,542

(22) Filed: Sep. 15, 2005

(65) Prior Publication Data

US 2006/0115984 A1    Jun. 1, 2006

(30) Foreign Application Priority Data

Sep. 15, 2004  (KR) ................ 10-2004-0073984

(51) Int. Cl.
*H01L 21/31*  (2006.01)
(52) U.S. Cl. ............... 438/763; 438/648; 438/656; 257/E29.16

(58) Field of Classification Search ........ 438/761–763, 438/776–777, 648, 685, 643–644, 653–654, 438/656, 680–681; 257/E29.16
See application file for complete search history.

(56) References Cited

U.S. PATENT DOCUMENTS

| 6,548,402 B2 | 4/2003 | Wang et al. ............ 438/680 |
| 2002/0195710 A1 | 12/2002 | Derderian et al. ...... 257/751 |
| 2005/0079696 A1* | 4/2005 | Colombo ................ 438/595 |

FOREIGN PATENT DOCUMENTS

| JP | 10-177971 | 6/1998 |
| KR | 1998-060512 | 10/1998 |
| KR | 1999-006046 | 1/1999 |
| KR | 10-20020083573 | 11/2002 |

* cited by examiner

*Primary Examiner*—H. Jey Tsai
(74) *Attorney, Agent, or Firm*—Myers Bigel Sibley & Sajovec

(57) ABSTRACT

Methods of forming metal nitride layers on a substrate include reacting a metal source gas with a nitrogen source gas in a process chamber to form a metal nitride layer on the substrate. The process chamber may have an atmosphere having a pressure of about 0.1 mTorr to about 5 mTorr and a temperature of about 200° C. to about 450° C. A ratio of the flow rate of the metal source gas to the flow rate of the nitrogen source gas may be "1" or more. An interlayer insulating layer may be formed on the semiconductor substrate prior to formation of the metal nitride layer. Some methods include forming a contact hole in the interlayer insulating layer to expose a portion of the semiconductor substrate prior to forming the metal nitride layer

34 Claims, 17 Drawing Sheets

METHODS OF FORMING METAL NITRIDE LAYERS, AND METHODS OF FORMING SEMICONDUCTOR STRUCTURES HAVING METAL NITRIDE LAYERS

CLAIM OF PRIORITY AND CROSS-REFERENCE TO RELATED APPLICATION

This patent application claims priority under 35 U.S.C. §119 to Korean Patent Application No. 10-2004-0073984, filed Sep. 15, 2004, the disclosure of which is incorporated herein by reference in its entirety.

FIELD OF THE INVENTION

The invention relates to methods of forming conductive layers, and more particularly, to methods of forming nitride conductive layers and methods of forming semiconductor structures having nitride conductive layers.

BACKGROUND

Metal nitride layers have been used in the fabrication of semiconductor devices. In particular, metal nitride layers have been used to form not only the upper and lower electrodes of capacitors in volatile semiconductor memory devices, but also as gate electrodes for volatile and nonvolatile semiconductor memory devices. Further, metal nitride layers have also been used to conformally fill contact holes in a metallization process in order to decrease the contact resistance between upper and lower conductive elements in multi-layered semiconductor electronic structures.

However, when a metal nitride layer is formed on a semiconductor substrate, projections may be formed at the surface of the metal nitride layer due to the presence of chlorine (Cl) in the layer. In cases where the metal nitride layer is used as the material of the upper and/or lower electrodes of a capacitor, such projections can increase leakage current during operation of the device. Further, in cases where the metal nitride layer is used as the gate electrode of an electronic device, such projections can cause an electrical short between the gate electrode pattern and a peripheral circuit wire. Moreover, in cases where the metal nitride layer is used in a contact hole, such projections may prevent an upper conductive element from making good contact with the metal nitride material, thereby increasing the contact resistance between upper and lower conductive regions in the structure. Accordingly, it may be desirable to reduce or eliminate the chlorine projections from metal nitride layers formed during semiconductor fabrication processes.

U.S. Pat. No. 6,548,402 to Wang, et al. discloses a method of depositing a thick titanium nitride film using a reaction between ammonia ($NH_3$) and titanium tetrachloride ($TiCl_4$). In one embodiment, an $NH_3$:$TiCl_4$ ratio of about 8.5 is used to deposit a TiN layer at a temperature of about 500° C. at a pressure of about 20 torr. In another embodiment, a composite TiN layer is formed by alternately depositing TiN layers of different thicknesses, using process conditions having different $NH_3$:$TiCl_4$ ratios. In one preferred embodiment, a TiN layer of less than about 20 Å is formed at an $NH_3$:$TiCl_4$ ratio of about 85, followed by a deposition of a thicker TiN layer at an $NH_3$:$TiCl_4$ ratio of about 8.5. By repeating the alternate film deposition using the two different process conditions, a composite TiN layer is formed.

SUMMARY

Methods of forming metal nitride layers according to embodiments of the invention include providing a substrate in a process chamber, and reacting a metal source gas with a nitrogen source gas in the process chamber to form a metal nitride layer on the substrate. The process chamber may have an atmosphere having a pressure of about 0.1 mTorr to about 5 mTorr and a temperature of about 200° C. to about 450° C. A ratio of the flow rate of the metal source gas to the flow rate of the nitrogen source gas may be "1" or more.

Methods of forming metal nitride layers according to further embodiments of the invention include forming an interlayer insulating layer on a semiconductor substrate, placing the semiconductor substrate in a process chamber, introducing a metal source gas and a nitrogen source gas into the process chamber, and reacting the nitrogen source gas and the metal source gas to form a metal nitride layer on the semiconductor substrate. The process chamber may have an atmosphere having a pressure of about 0.1 mTorr to about 5 mTorr and a temperature of about 200° C. to about 450° C. A ratio of the flow rate of the metal source gas to the flow rate of the nitrogen source gas may be "1" or more.

In some embodiments, methods according to the invention may further include forming a contact hole in the interlayer insulating layer to expose a portion of the semiconductor substrate and forming an electrode node in the contact hole. The metal nitride layer may cover the interlayer insulating layer and the electrode node.

In some embodiments, methods according to the invention may include forming a contact hole in the interlayer insulating layer to expose a portion of the semiconductor substrate. The metal nitride layer may be formed on a sidewall of the contact hole and exposed portions of the semiconductor substrate.

In some embodiments according to the invention, the nitrogen source gas may have a partial pressure of about 0.05 Torr in the process chamber. The metal nitride layer may include titanium nitride (TiN), the nitrogen source gas may include ammonia ($NH_3$), and the metal source gas may include titanium chloride ($TiCl_4$).

Methods according to some embodiments of the invention may include introducing an atmosphere gas, together with the metal source gas and the nitrogen source gas, into the process chamber. The atmosphere gas may facilitate a smooth flow of the metal source gas and the nitrogen source gas in the process chamber. In some embodiments, the atmosphere gas may comprise argon (Ar).

Methods according to some embodiments of the invention may further include introducing a purge gas into the process chamber after reacting the metal source gas and the nitrogen source gas. The purge gas may discharge the metal source gas and the nitrogen source gas from the process chamber. The purge gas may include nitrogen ($N_2$).

Methods according to still further embodiments of the invention may include performing a post treatment of the semiconductor substrate after introducing the purge gas. The post treatment may reduce chlorine (Cl) formed in the metal nitride layer. The post treatment may be performed with a plasma formed using nitrogen ($N_2$) and hydrogen ($H_2$). In further embodiments, the post treatment may be performed with a plasma formed using ammonia ($NH_3$), $PH_3$ and/or $B_2H_3$. The post treatment may be performed in the process chamber or outside the process chamber.

DETAILED DESCRIPTION OF EMBODIMENTS ACCORDING TO THE INVENTION

Figure 1:
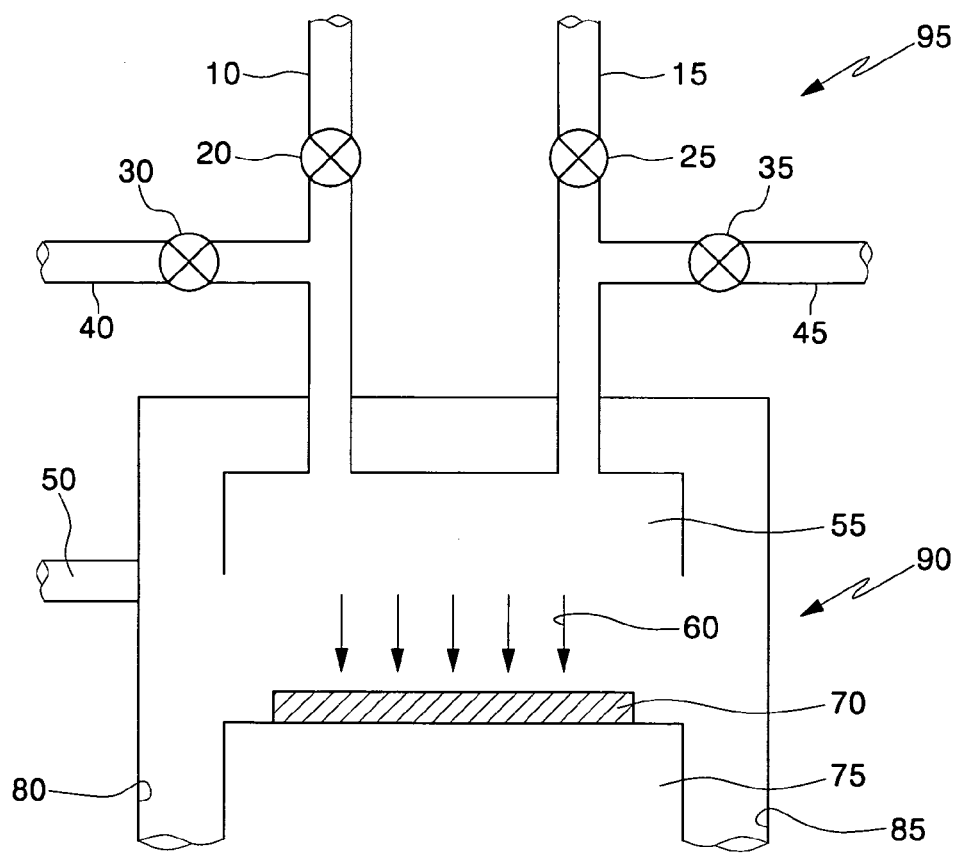
FIG. 1 is a schematic cross-sectional view showing an exemplary deposition system in which embodiments of the invention may be implemented.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on" or "connected to" another element or layer, it can be directly on or directly connected to the other element or layer or intervening elements or layers may be present.

Like reference numerals refer to like elements throughout. As used herein the term "and/or" includes any and all combinations of one or more of the associated listed items.

It will be understood that, although the terms first, second, etc. may be used herein to describe various elements, components or layers, these elements, components or layers should not be limited by these terms. These terms are only used to distinguish one element, component or layer from another element, component or layer. Thus, a first element, component or layer discussed below could be termed a second element, component or layer without departing from the teachings of the present invention.

Spatially relative terms such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of devices or structures in use or operation in addition to the orientation depicted in the figures. For example, if a device or structure in the figures is turned over, elements described as "below" or "beneath" other elements or features would then be oriented "above" the other elements or features. Thus, the exemplary term "below" can encompass both an orientation of above and below. A device or structure may be otherwise oriented (rotated 90 degrees or at other orientations) and the spatially relative descriptors used herein interpreted accordingly. It will also be appreciated by those of skill in the art that references to a structure or feature that is disposed "adjacent" another feature may have portions that overlap or underlie the adjacent feature.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, elements or components, but do not preclude the presence or addition of one or more other features, elements or components.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
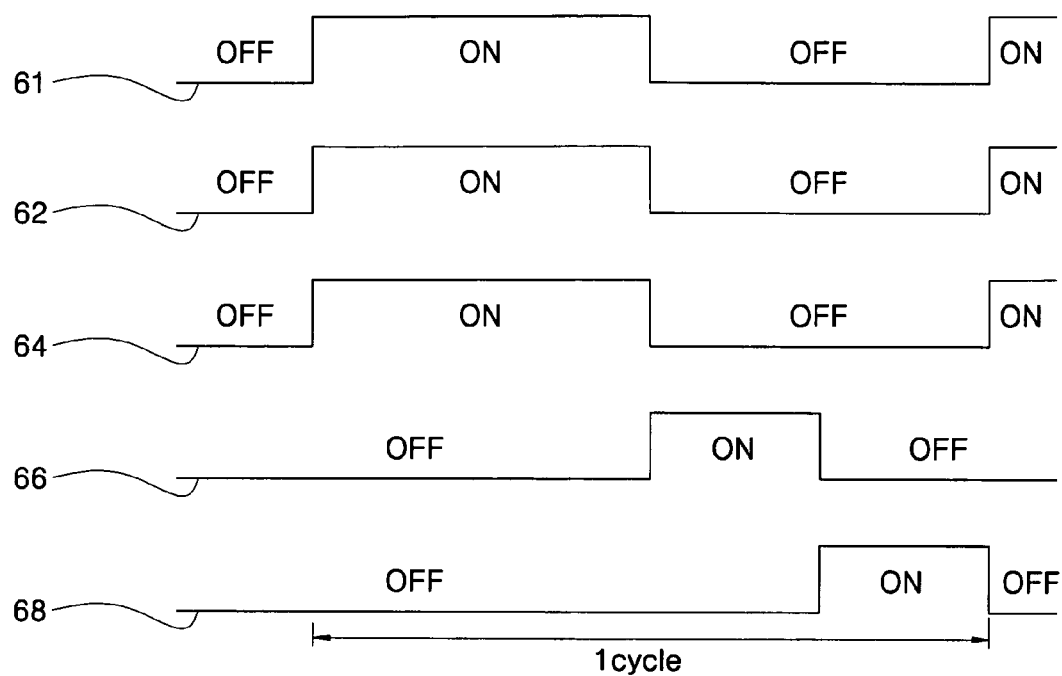
FIG. 2 is a timing diagram illustrating some aspects of deposition processes according to some embodiments of the invention.

FIG. 1 is a cross-sectional view showing a deposition system 95 in which some embodiments of the invention may be implemented, and FIG. 2 is a timing diagram illustrating some aspects of a deposition process according to some embodiments of the invention. Further, FIG. 3 is a schematic plan view showing a substrate having a metal nitride layer formed according to some embodiments of the invention.

Figure 3:
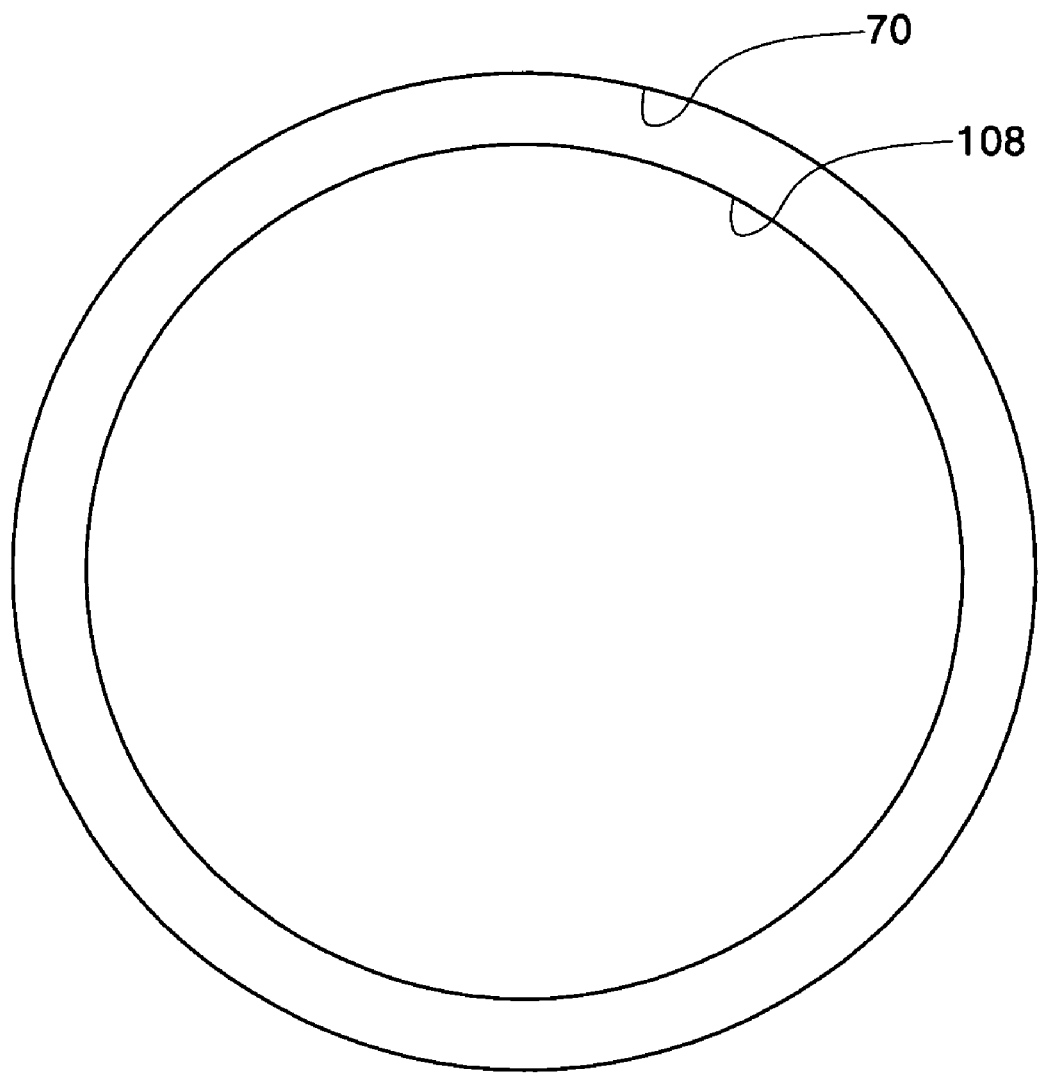
FIG. 3 is a schematic plan view showing a semiconductor substrate having a metal nitride layer according to some embodiments of the invention.

Referring to FIGS. 1 to 3, a semiconductor substrate 70 may be placed into a process chamber 90 of the deposition system 95. In more detail, in some embodiments, the substrate 70 is positioned on a chuck 75 in the process chamber 90. Substrate 70 may include a semiconductor substrate. Moreover, substrate 70 may include a semiconductor substrate on which one or more layers have been formed, including epitaxial semiconductor layers, insulating layers, and/or conductive layers. The chuck 75 may have a temperature less than 450° C. The deposition system 95 may be configured to process the semiconductor substrate 70 in a single-sheet type process or a batch type process. The deposition system 95 may further include a showerhead 55 within the process chamber 90. The showerhead 55 may be configured to spray process source gases 60, which may be introduced from the exterior of the process chamber 90, onto the semiconductor substrate 70. The process source gases 60 may respectively be a metal source gas and a nitrogen source gas.

Each of the showerhead 55 and the process chamber 90 may include a plurality of pipes operably connected thereto. As illustrated in FIG. 1, the deposition system 95 may include process source gas pipes 10 and 15, purge gas pipes 40 and 45, an atmosphere gas pipe 50, and discharge pipes 80 and 85. Though not illustrated in FIG. 1, additional pipes and other equipment such as lines, valves, thermocouples, ports, heating elements, etc., may be present in deposition system 95. The process source pipes 10 and 15 and the purge gas pipes 40 and 45 may respectively have valves 20 and 25, 30 and 35 to control the flow of the process source gases and a purge gas. The deposition equipment 95 may additionally include one or more valves, though not illustrated, to control the flow of an atmosphere gas into the process chamber 90.

The process source gases, the purge gas and the atmosphere gas may be introduced into the process chamber 90 according to a predetermined algorithm, for example according to the algorithm illustrated in the timing diagram of FIG. 2. As illustrated in FIG. 2, a timing algorithm according to some embodiments of the invention includes the first to fifth timing signals 61, 62, 64, 66 and 68 which indicate the state of various gas flows into the process chamber 90 during a deposition process cycle. For example, timing signal 61 illustrates the state of the flow of the metal source gas, timing signal 62 illustrates the state of the flow of the nitrogen source gas, timing signal 64 illustrates the state of the flow of the atmosphere gas, and timing signal 66 illustrates the state of the flow of the purge gas into the process chamber 90.

According to the algorithm illustrated in FIG. 2, the valves 20 and 25 of the process source pipes 10 and 15 and the valve of the atmosphere gas pipe 50 are opened during "ON" states of the first, second and third timing signals 61, 62 and 64 to introduce the metal source gas, the nitrogen source gas and the atmosphere gas into the process chamber 90. The atmosphere gas may, for example, include an inert gas such as argon (Ar). The metal source gas and the nitrogen source gas may respectively include, for example, titanium tetrachloride ($TiCl_4$) and/or ammonia ($NH_3$). The metal source gas and the nitrogen source gas may flow freely within the process chamber 90 along with the atmosphere gas. When the metal source gas and the nitrogen source gas reach the semiconductor substrate 70 (which in some embodiments may be preheated to a temperature of 450° or less), they may react with each other and form a metal nitride layer 108 on the semiconductor substrate 70. (The metal nitride layer 108 is hereinafter referred to as a titanium nitride (TiN) layer. However, it will be understood by those skilled in the art that other metals besides Ti may be employed in other embodiments of the invention.)

After the flow of the metal source gas, the nitrogen source gas and the atmosphere gas has persisted for a predetermined time, valves 20 and 25 of the process source pipes 10 and 15 and the valve of the atmosphere gas pipe 50 may be closed, as indicated by the first to third timing signals 61, 62 and 64 transitioning to the "OFF" states. The valves 30 and 35 for purge gas pipes 30 and 35 may be opened (as indicated by the "ON" state of the fourth timing signal 66) in coordination with the first to third timing signals 61, 62 and 64 transitioning to the "OFF" states. It will be understood by those skilled in the art that the timing and operation of particular gas flow valve controls may depend on the specific equipment in which the process is being performed. Thus, for example, the purge gas flow may be switched to the "ON" state before, contemporaneously with, or after the source gases and/or atmosphere gas flow is switched to the "OFF" state. Moreover, instead of being switched on and off abruptly, gas flows may be ramped up or ramped down as desired and/or may be switched between a shunt or bypass flow and an active flow according to the state of control signals 61, 62, 64 and 66. While the fourth timing signal 66 is in the "ON" state, the valves 30 and 35 of the purge gas pipes 40 and 45 are open, thereby introducing the purge gas into the process chamber 90. The purge gas may include an inert gas such as, for example, nitrogen ($N_2$). The purge gas may discharge the remaining metal source gas and the nitrogen source gas from the process chamber 90 through the discharge pipes 80 and 85.

When the fourth timing signal 66 transitions to the "OFF" state, the fifth timing signal 68 may switch to the "ON" state. When the fifth timing signal 68 is in the "ON" state, an optional post treatment of the semiconductor substrate 70 may be performed using a plasma. The post treatment may be performed in-situ, i.e., in the same process chamber 90. The post treatment may additionally or alternatively be performed in another process chamber (not shown) of the deposition system 95 or in another system. The post treatment may eliminate or reduce chlorine (Cl) formed in the titanium nitride layer 108. In some embodiments, the plasma may be formed using ammonia. In further embodiments, the plasma may be formed using nitrogen ($N_2$) and hydrogen ($H_2$). In other embodiments, the plasma may be formed using $PH_3$ or $B_2H_3$. One cycle of the the deposition finishes when the fifth timing signal 68 reaches the "OFF" state. Depending on the desired resistivity and the surface state of the deposited titanium nitride layer 108, the optional post treatment may or may not be performed.

As illustrated in FIG. 3, the resulting structure is a substrate 70 on which a titanium nitride layer 108 is formed. In some embodiments, during the deposition of the titanium nitride layer 108 on the semiconductor substrate 70, the atmosphere within the process chamber 90 may be maintained at a temperature of about 200 to about 450° C. and a pressure of about 0.1 to about 5 mTorr.

Figure 4:
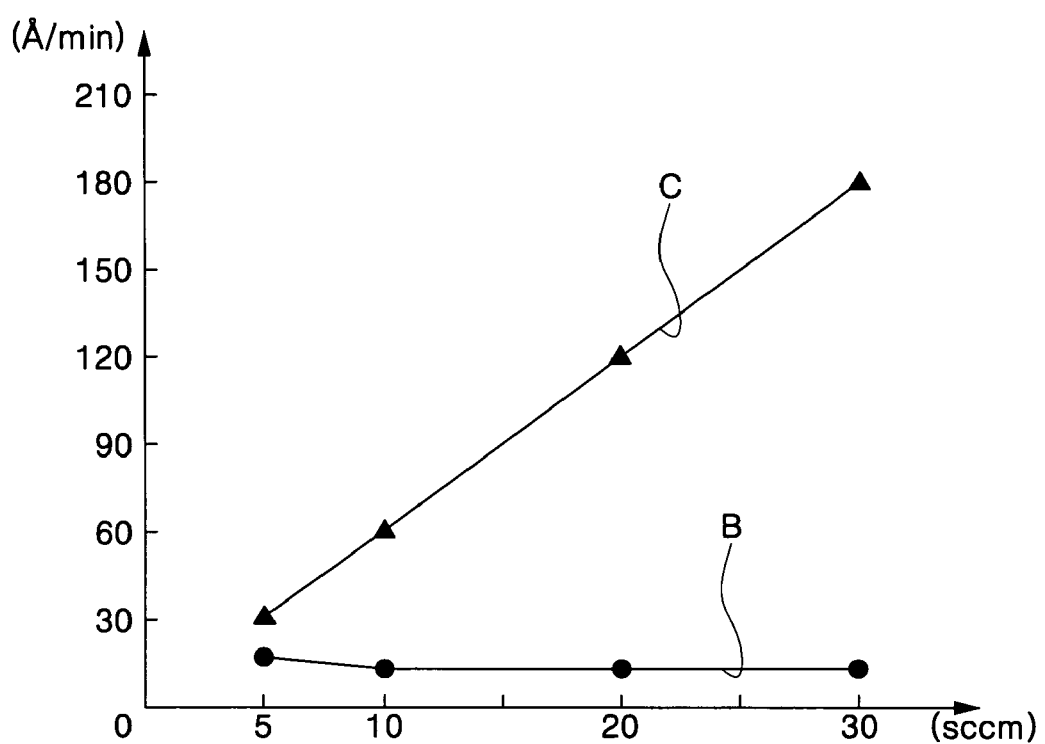
FIG. 4 is a graph illustrating deposition rates of metal nitride layers according to some embodiments of the invention.
Figure 5:
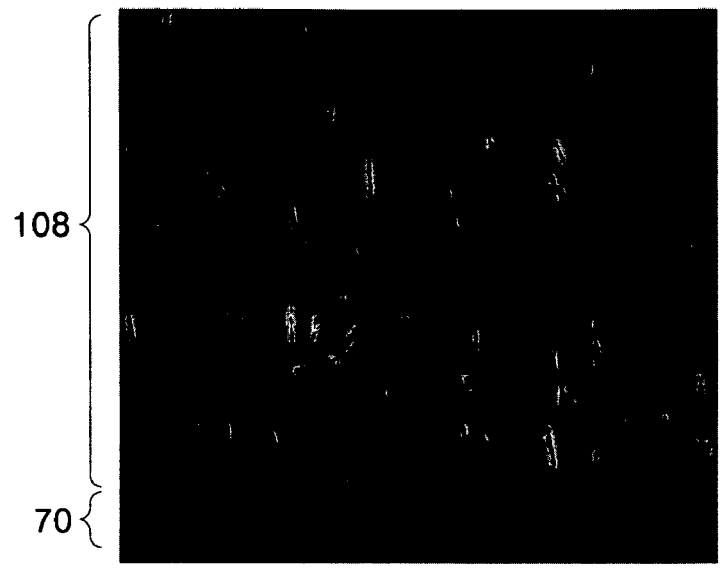
FIGS. 5 to 9 are cross-sectional micrographs showing upper portions of semiconductor substrates having metal nitride layers formed thereon according to some embodiments of the invention.

FIG. 4 is a graph illustrating the deposition rates of metal nitride layers according to some embodiments of the invention, and FIGS. 5 to 9 are cross-sectional micrographs showing upper surfaces of semiconductor substrates having metal nitride layers 108 formed thereon according to some embodiments of the invention. Further, FIG. 10 is a graph illustrating observed surface roughnesses of the metal nitride layers 108 of FIGS. 5 to 9.

Referring to FIGS. 3 to 10, a titanium nitride layer 108 may be formed on a semiconductor substrate 70 in the process chamber 90 under the process conditions described above. The effect of variations in the flow rates of the metal source gas (TiCl$_4$) and the nitrogen source gas (NH$_3$) on the growth rate of the TiN layer 108 is illustrated in FIG. 4. In particular, the curves B and C illustrate the effect on the growth rate of the titanium nitride layer 108 of varying the metal source gas flow rate (curve B) and/or the nitrogen source gas flow rate (curve C). In FIG. 4, an abscissa (X-axis) indicates the flow rate (in sccm) of the metal source gas (curve B) or the nitrogen source gas (curve C), and an ordinate (Y-axis) indicates the resulting deposition rate in terms of Angstroms per minute (Å/min).

Curve B illustrates the results obtained by depositing a TiN layer 108 using a fixed flow rate of 5 sccm for the nitrogen source gas and varying the metal source gas flow rate. Specifically, metal source gas flow rates of 5, 10, 20 and 30 sccm were used. As illustrated by Curve B of FIG. 4, even though the flow of the metal source gas is increased from 5 to 30 sccm, the deposition rate of the titanium nitride layer 108 does not substantially increase. Thus, Curve B is a characteristic of a surface reaction rate limited CVD process. This means that the metal source gas reacts sufficiently at the semiconductor substrate 70 to form a titanium nitride layer 108 with a dense crystallization.

Curve C illustrates the results obtained by depositing a TiN layer 108 using a fixed flow rate of 5 sccm for the metal source gas and varying the nitrogen source gas flow rate. Specifically, nitrogen source gas flow rates of 5, 10, 20 and 30 sccm were used. As illustrated by Curve C of FIG. 4, as the nitrogen source rate is increased from 5 to 30 sccm, the titanium nitride growth rate shows a corresponding increase. Thus, Curve C is characteristic of a mass transfer limited CVD process. In other words, as the flow of the nitrogen source gas increases, the deposition rate of the titanium nitride layer 108 increases. This means that the nitrogen source gas flow rate limits the surface reaction of the metal source at the semiconductor substrate. Accordingly, when the nitrogen source flow rate exceeds the metal source flow rate, the resulting titanium nitride layer 108 may have a porous crystallization.

In light of the foregoing results, titanium nitride layers 108 were respectively formed on semiconductor substrates 70 with the metal source gases and the nitrogen source gases having flow rates of 30/30, 20/20, 10/10, and 5 sccm/5 sccm. In other words, titanium nitride layers 108 were formed on the semiconductor substrates 70 with the metal source gas and the nitrogen source gas having various flow rates selected such that that the ratio of the metal source gas flow rate to the nitrogen source gas flow rate used to form a particular layer was about "1". FIGS. 5 to 8 are cross-sectional micrographs of titanium nitride layers 108 grown as described above. As can be seen from FIGS. 5 to 8, the titanium nitride layers 108 exhibit different surface roughnesses depending on the flow rate of the metal source gas and the nitrogen source gas. The titanium nitride layers 108 shown in FIGS. 5 to 8 were not subjected to a post-treatment as described above. The degree of the surface roughness of the titanium nitride layers 108 may be affected by the crystallization of the titanium nitride layer 108 and the amount of chlorine (Cl) existing in the surface of the titanium nitride layer 108. The chlorine (Cl) may react with titanium nitride (TiN) to form projections 110 as shown in FIG. 7 at the surface of the titanium nitride layer 108.

It is known in the art that the metal source gas (TiCl$_4$) has a lower resolution than the nitrogen source gas (NH$_3$) within the temperature range of about 200 to about 450° C. That is, if the flow rate of the metal source gas in the process chamber 90 is high compared with the flow rate of the nitrogen source gas, the resulting titanium nitride layer 108 may have a large amount of chlorine (Cl) at its surface. As is evident from FIGS. 5 to 8, as the flow rates of the metal source gas and the nitrogen source gas are decreased in a sequence of 30/30, 20/20, 10/10, and 5 sccm/5 sccm, the projections 110 located at the surfaces of the titanium nitride layers 108 may decrease in number. It is presently believed that this is because as the flow rates of the metal source gas and the nitrogen source gas are decreased, the CVD process approaches a surface reaction rate limited region, and at the same time, the amount of chlorine (Cl) introduced into the process chamber 90 is decreased. Accordingly, when the metal source gas and the nitrogen source gas respectively have the flow rates of 5 sccm and 5 sccm, the titanium nitride layer 108 formed on the semiconductor substrate 70 may have a smooth surface. Additionally, the nitrogen source gas may have a partial pressure of about 0.05 Torr within the process chamber 90.

FIG. 10 is a graph illustrating the observed surface roughnesses of the titanium nitride layers 108 shown in FIGS. 5 to 8. As mentioned above, the surface roughness of the titanium nitride layers 108 appears to improve as the flow rate of the metal source gas is decreased. This is believed to be due to a decrease in the size of projections 110 at the surface of the titanium nitride layers 108 as the flow rates of the metal source gas and the nitrogen source gas are decreased.

Figure 8:
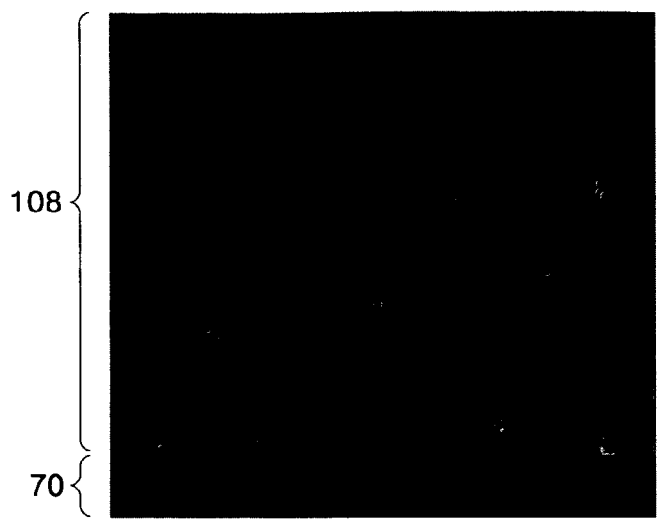
Figure 9:
Figure 10:
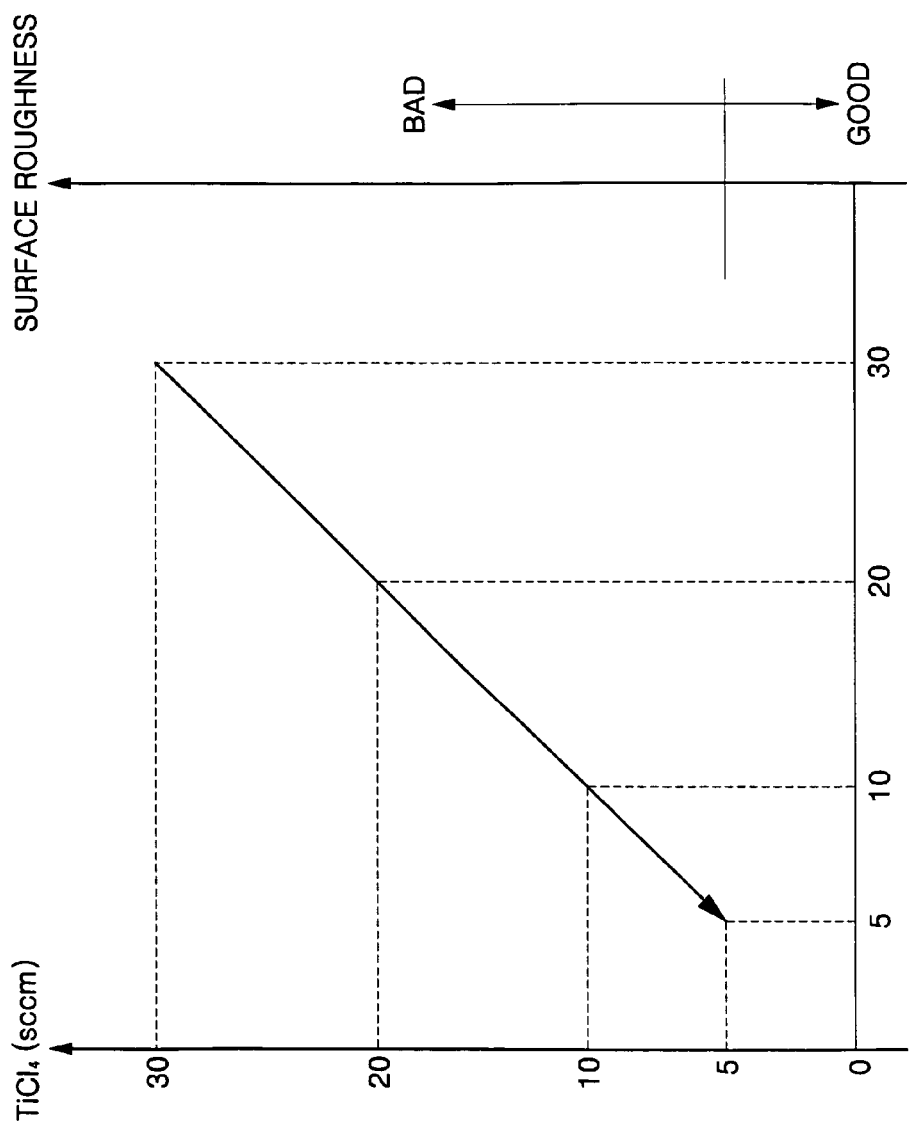
FIG. 10 is a graph illustrating observed surface roughnesses of the metal nitride layers of FIGS. 5 to 9.
Figure 11:
FIGS. 11 to 14 are cross-sectional micrographs showing upper portions of semiconductor substrates having metal nitride layers formed theron according to further embodiments of the invention.
Figure 12:
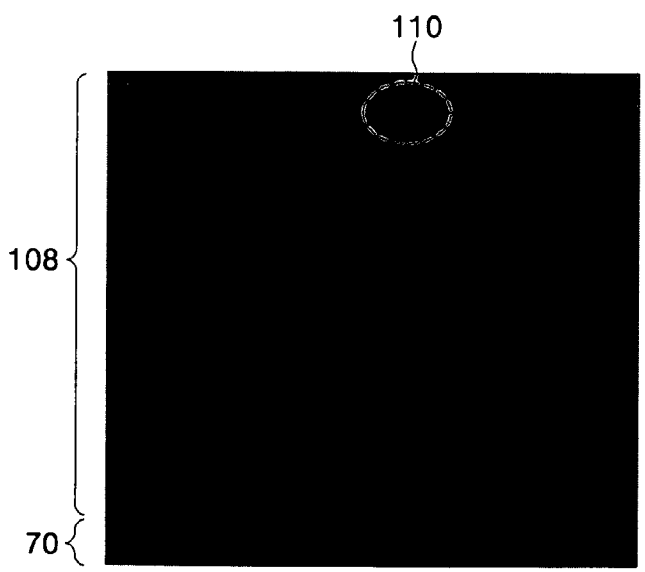
Figure 13:
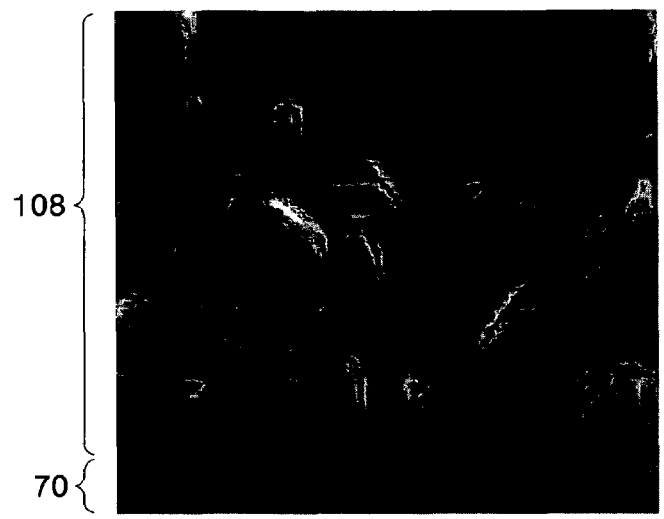
Figure 14:
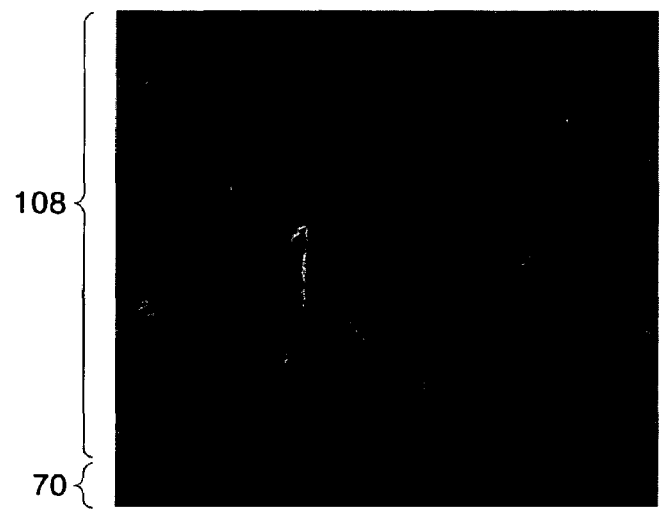

FIG. 9 is a cross sectional micrograph of a titanium nitride layer 108 as illustrated in FIG. 8, which has been post-treated in the manner described above. As a result of the plasma post treatment, the amount of chlorine (Cl) present in the titanium nitride layer 108 may be reduced or eliminated. As discussed above, the plasma may be formed using ammonia (NH$_3$). In some embodiments, the plasma may be formed using nitrogen (N$_2$) and hydrogen (H$_2$). In further embodiments, the plasma may be formed using PH$_3$ or B$_2$H$_3$. The projections 110 the surface of the titanium nitride layer 108 are noticeably decreased in FIG. 9 (after post treatment) in comparison to FIG. 8 (without post treatment).

Figure 15:
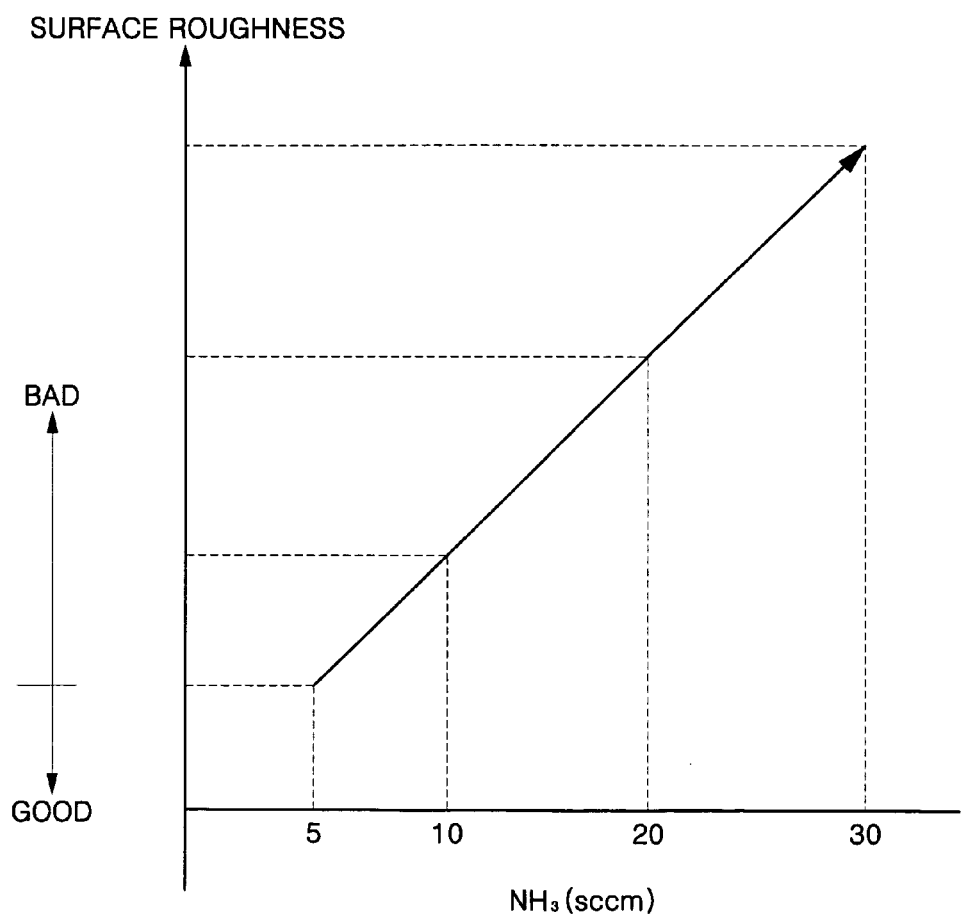
FIG. 15 is a graph illustrating observed surface roughnesses of the metal nitride layers of FIGS. 11 to 14.
Figure 16:
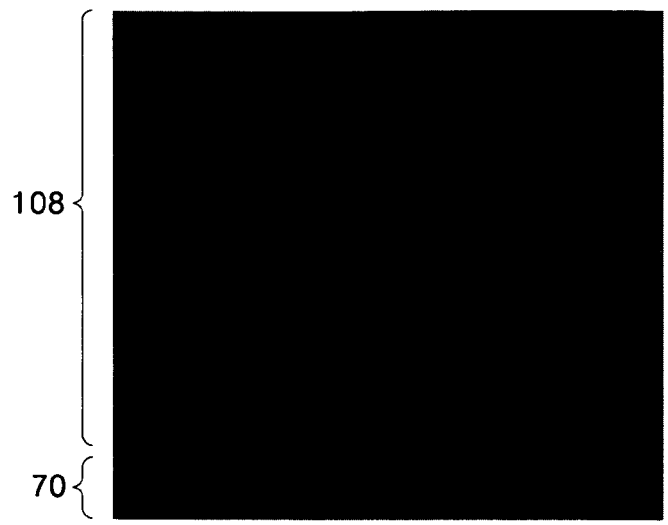
FIGS. 16 to 19 are cross-sectional micrographs showing upper portions of semiconductor substrates having metal nitride layers formed thereon according to still further embodiments of the invention.
Figure 17:
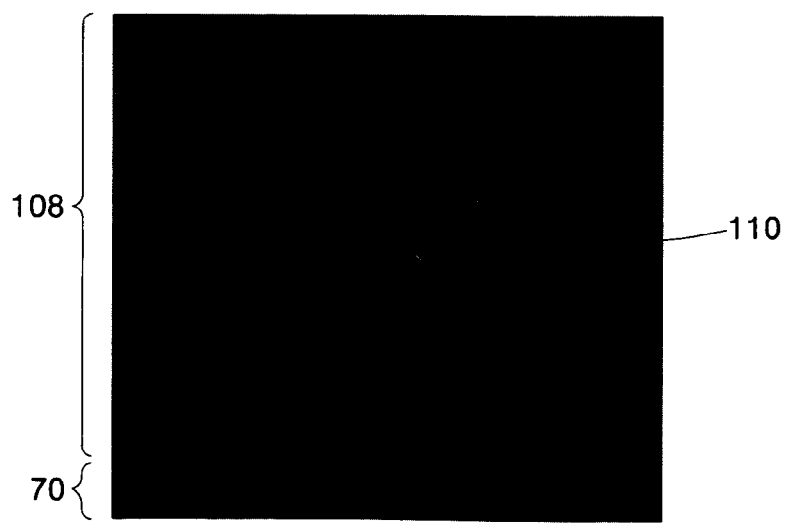
Figure 18:
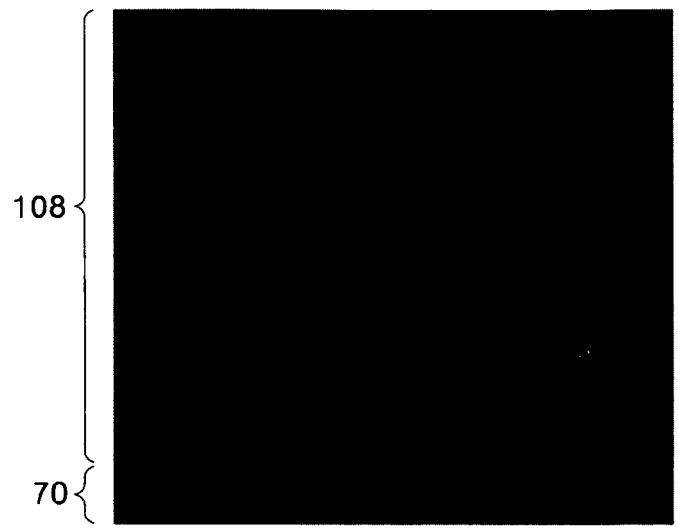
Figure 19:

FIGS. 11 to 14 are cross sectional micrographs showing upper portions of semiconductor substrates 70 having metal nitride layers 108 formed thereon according to further embodiments of the invention. FIG. 15 is a graph illustrating observed surface roughnesses of the metal nitride layers shown in FIGS. 11 to 14.

Referring to FIGS. 11 to 15, titanium nitride layers 108 were respectively formed on semiconductor substrates 70 with the metal source gas (TiCl$_4$) having a fixed flow of 5 sccm and the nitrogen source gas (NH$_3$) having a varied flow, in a process chamber 90 having a temperature of about 200 to about 450° C. and a pressure of about 0.1 to about 5 mTorr.

In particular, the titanium nitride layers shown in FIGS. 11 to 14 were formed using metal source gas and the nitrogen source gas flows of 5/5, 5/10, 5/20 and 5 sccm/30 sccm, respectively. In other words, the titanium nitride layers 108 shown in FIGS. 11 to 14 were formed with the nitrogen source gas having a varied flow and with the ratio of the metal source gas flow rate to the nitrogen source gas flow rate being "1" or less. FIGS. 11 to 14 sequentially show titanium nitride layers 108 having different surface roughnesses depending on the flow rate of the metal source gas and the nitrogen source gas. The titanium nitride layers shown in FIGS. 11 to 14 were not subjected to a plasma post treatment. As noted above, the degree of the surface roughness of the titanium nitride layers 108 (which corresponds to the number and size of the projections 110) may be affected by the crystallization of the titanium nitride layer 108 and the amount of chlorine (Cl) existing in the surface of the titanium nitride layer 108.

At a temperature of about 200 to about 450° C. in the process chamber 90, the nitrogen source gas may have a larger resolution than the metal source gas. Accordingly, the nitrogen source gas may prevent a surface reaction of the metal source gas at the semiconductor substrate 70, which may result in the formation of a titanium nitride layer 108 with a porous crystallization. Furthermore, when the ratio of the metal source gas to the nitrogen source gas is less than "1", the titanium nitride layer 108 may have a porous crystallization because it may be deposited in a mass transfer-limited CVD process. Due to its porous crystallization, the titanium nitride layer 108 may easily react with chlorine (Cl). As illustrated in FIGS. 11-14, as the flow rate of the nitrogen source gas is increased, the resulting titanium nitride layer 108 may have an increased number of projections 110 at its surface. Accordingly, as the flow rate of the nitrogen source gas is increased, the resulting titanium nitride layer 108 may have an increased surface roughness.

However, when the metal source gas and the nitrogen source gas respectively have flow rates of 5 sccm and 5 sccm, the resulting titanium nitride layer 108 may have a smooth surface. The nitrogen source may have a partial pressure of about 0.05 Torr in the process chamber 90 during formation of the titanium nitride layer 108.

FIG. 15 is a graph illustrating the observed surface roughnesses of the titanium nitride layers 108 shown in FIGS. 11 to 14. As mentioned above, the surface roughness of the titanium nitride layers 108 appears to worsen as the flow of the nitrogen source is increased. This is believed to be because as the flow of the nitrogen source gas is increased while the flow of the metal source gas remains fixed, the projections 110 at the surface of the titanium nitride layer 108 may increase.

Figure 20:
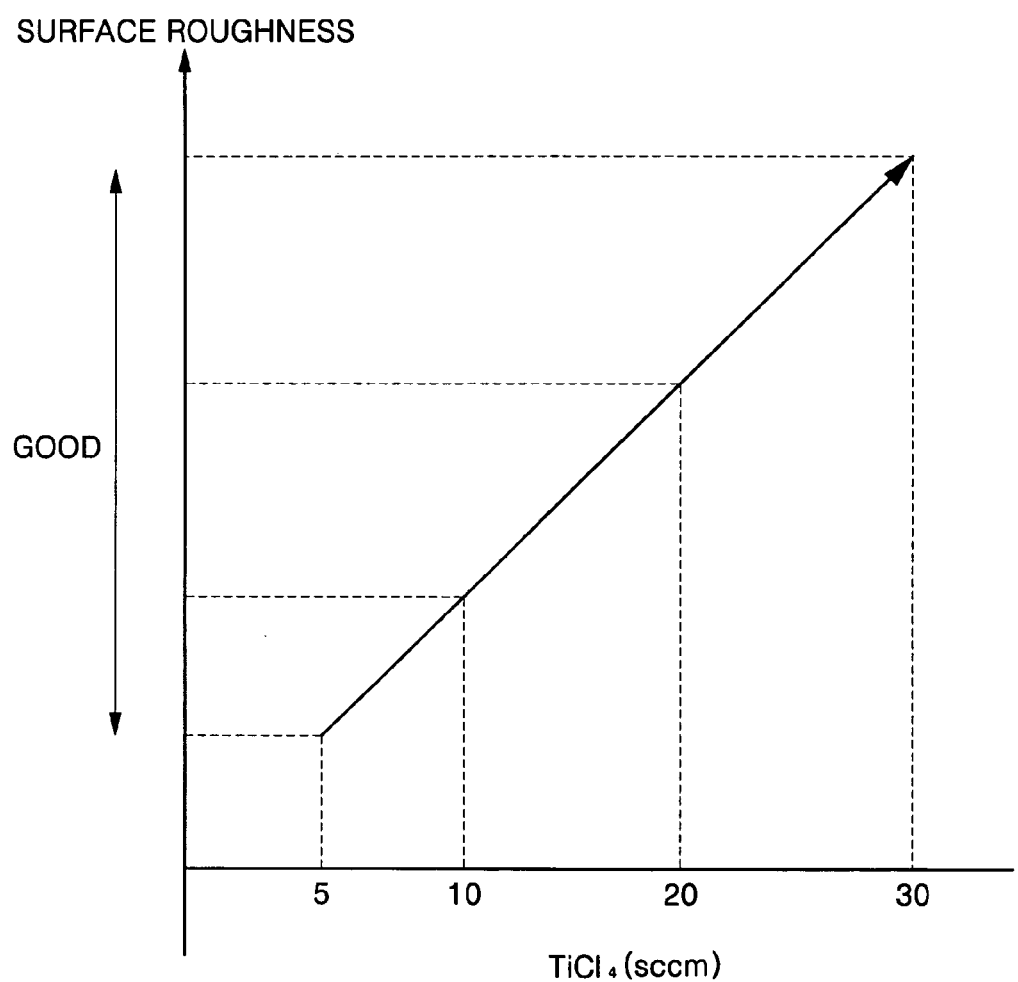
FIG. 20 is a graph illustrating observed surface roughnesses of the metal nitride layers of FIGS. 16 to 19.

FIGS. 16 to 19 are cross-sectional micrographs showing upper portions of semiconductor substrates 70 having metal nitride layers 108 formed thereon according to still further embodiments of the invention. FIG. 20 is a graph illustrating observed surface roughnesses of the metal nitride layers 108 of FIGS. 16 to 19.

Referring to FIGS. 16 to 20, titanium nitride layers 108 were respectively formed on the semiconductor substrates 70 with the nitrogen source gas (NH$_3$) having a fixed flow rate of 5 sccm and the metal source gas (TiCl$_4$) having a varied flow rate, in a process chamber 90 having a temperature of about 200 to about 450° C. and a pressure of about 0.1 to about 5 mTorr.

To form the titanium nitride layers 108 shown in FIGS. 16 to 20, the metal source gas and the nitrogen source gas respectively had flow rates of 5/5, 10/5, 20/5 and 30 sccm/5 sccm. In other words, the titanium nitride layers 108 were formed on the semiconductor substrates 70 with the metal source gas having varied flow rates satisfying a condition that the ratio of the metal source gas flow rate to the nitrogen source gas flow rate was "1" or more. The nitrogen source gas had a partial pressure of about 0.05 Torr in the process chamber 90. FIGS. 16 to 19 sequentially show the titanium nitride layers 108 having different surface roughnesses depending on the flow rates of the metal source gas and the nitrogen source gas. The titanium nitride layers 108 shown in FIGS. 16 to 19 were not plasma post-treated. As noted above, the degree of the surface roughness of the titanium nitride layers 108 (which corresponds to the number and size of the projections 110) may be affected by the crystallization of the titanium nitride layer 108 and the amount of chlorine (Cl) existing in the surface of the titanium nitride layer 108.

At the temperature of about 200 to about 450° C. of the process chamber 90, the metal source gas may have a smaller resolution than the nitrogen source gas. Thus, when the ratio of the metal source gas flow rate to the nitrogen source gas flow rate is "1" or more, the titanium nitride layer 108 may have a dense crystallization because it may be deposited in a surface reaction rate limited CVD process. Due to their dense crystallization, the resulting titanium nitride layers 108 may not easily react with chlorine (Cl). As the flow rate of the metal source gas is increased, the projections 110 on the surface of the titanium nitride layer 108 do not appear to increase in number. Accordingly, if the nitrogen source gas has a fixed partial pressure of about 0.05 Torr in the process chamber 90, the titanium nitride layer 108 may have good surface roughness irrespective of the flow rate of the metal source gas.

FIG. 20 is a graph of the observed surface roughnesses of the titanium nitride layers 108 shown in FIGS. 16 to 19. As mentioned above, the titanium nitride layers 108 appear to have good surface roughnesses irrespective of the flow rate of the metal source gas. This is believed to be because when the nitrogen source gas is fixed to the partial pressure of about 0.05 Torr, the projections 110 on the surfaces of the titanium nitride layers 108 are not visually increased in number even though the flow rate of the metal source gas is increased.

Figure 21:
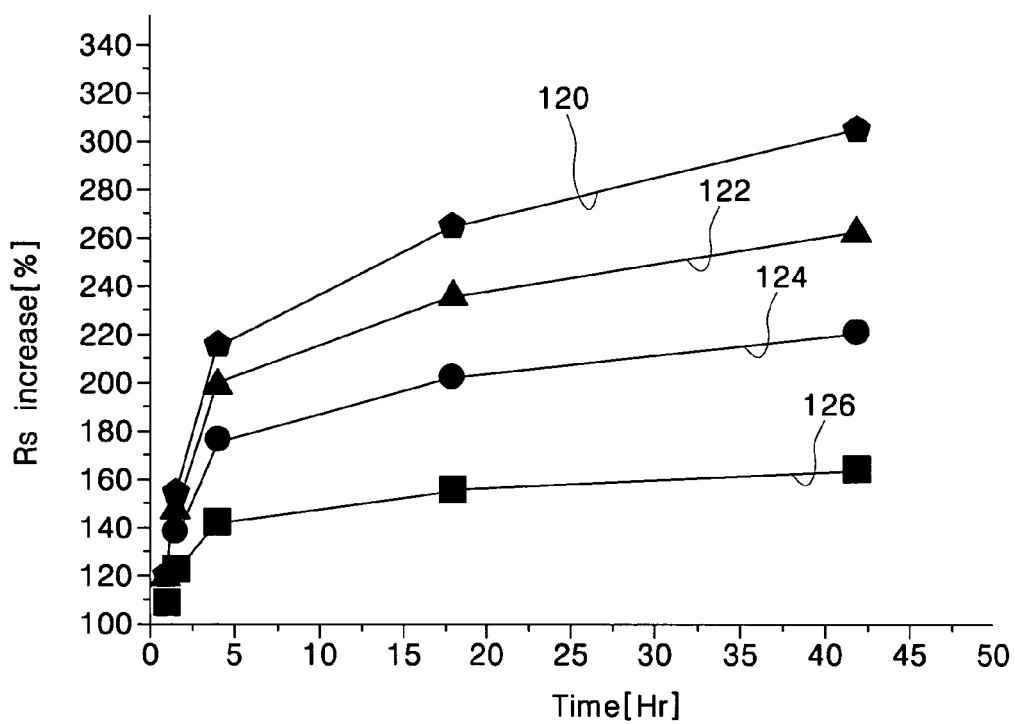
FIG. 21 is a graph illustrating sheet resistances of the metal nitride layers of FIGS. 6 to 9.

FIG. 21 is a graph illustrating measured sheet resistances of the metal nitride layers 108 shown in FIGS. 6 to 9.

As discussed above, the titanium nitride layers 108 shown in FIGS. 6 to 9 were respectively formed on semiconductor substrates 70 with the metal source gas and the nitrogen source gas having flow rates of 30/30, 20/20, 10/10, and 5 sccm/5 sccm. As shown in FIGS. 6 to 9, the titanium nitride layers 108 (which were not plasma post-treated) exhibited different surface roughnesses depending on the flow rates of the metal source gas and the nitrogen source gas.

Figure 6:
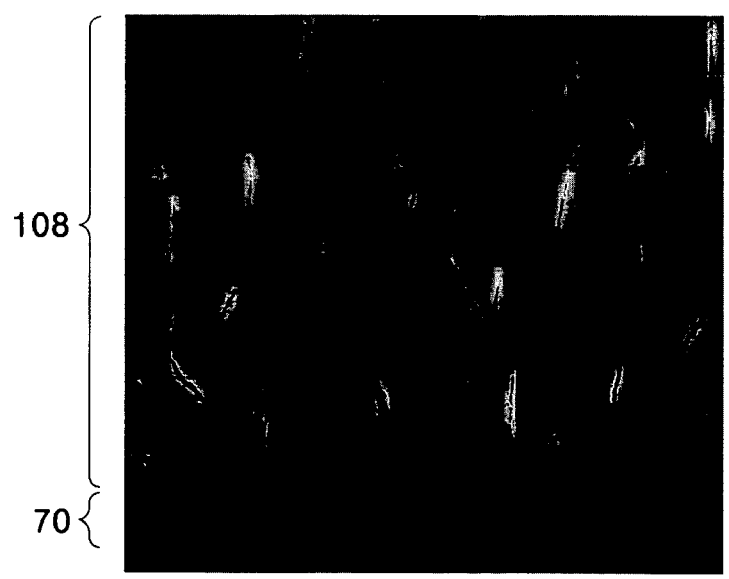
Figure 7:

In particular, the surface roughnesses of the titanium nitride layers 108 shown in FIGS. 6 to 8 improved as the flow rates of the metal source gas and the nitrogen source gas were decreased. Accordingly, the titanium nitride layer 108 of FIG. 8 had a smoother surface than the titanium nitride layers 108 of FIGS. 6 and 7. Furthermore, the titanium nitride layer 108 of FIG. 9 (which was plasma post-treated) showed improved surface roughness in comparison to the titanium nitride layer 108 of FIG. 8. Accordingly, the titanium nitride layer 108 of FIG. 9 had a smoother surface than the titanium nitride layer 108 of FIG. 8.

FIG. 21 shows a time-dependent cumulative percentage increase (%) of sheet resistance of the titanium nitride layers 108 when exposed to air. In FIG. 21, an abscissa (X-axis) indicates the time for which the titanium nitride layers 108 were exposed to the air, and an ordinate (Y-axis) indicates the cumulative percentage increase in the sheet resistance of the titanium nitride layers 108 as a function of the exposure time. FIG. 21 includes four curves 120, 122, 124 and 126. Curves 124 and 126 represent the time-dependent cumulative percentage increase of the sheet resistances of the titanium nitride layers 108 of FIGS. 8 and 9, respectively. The remaining curves 120 and 122 represent the time-dependent cumulative percentage increase of the sheet resistances of the titanium nitride layers 108 of FIGS. 6 and 7, respectively.

Each of the titanium nitride layers 108 may have a different oxidation speed at which the projections 110 are oxidized when they are exposed to the air, depending on the degree of the surface roughness of the layer 108. In other words, as the surface roughness of the titanium nitride layers 108 worsens, the projections 110 on the layers 108 may react more readily with oxygen in the air. Accordingly, the titanium nitride layers 108 shown in FIGS. 6 to 9 may have small time-dependent cumulative percentage increases of sheet resistance in a sequence based on the surface roughness of the nitride layers 108.

As a result, the titanium nitride layers 108 of FIGS. 8 and 9 may exhibit small cumulative increases of the sheet resistances as a function of exposure time, and may have smooth surfaces compared with the titanium nitride layers 108 FIGS. 6 and 7. Thus, the methods used to form the titanium nitride layers 108 of FIGS. 8 and 9 may be advantageously employed in a semiconductor fabrication process.

Methods of forming semiconductor structures utilizing methods of forming metal nitride layers according to embodiments of the invention will now be described.

Figure 22:
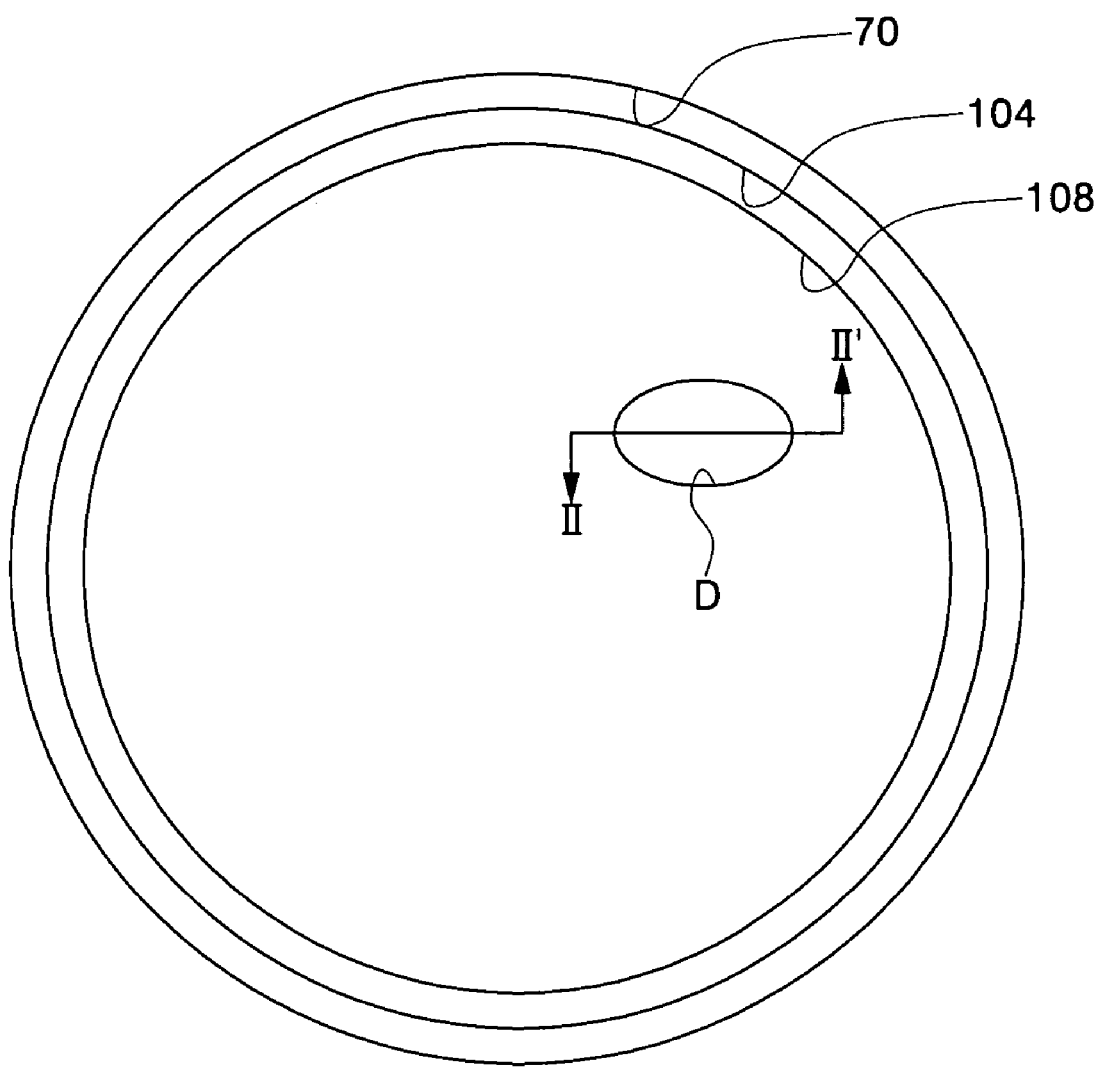
FIG. 22 is a schematic plan view illustrating a semiconductor substrate having an interlayer insulating layer and a metal nitride layer according to further embodiments of the invention.
Figure 23:
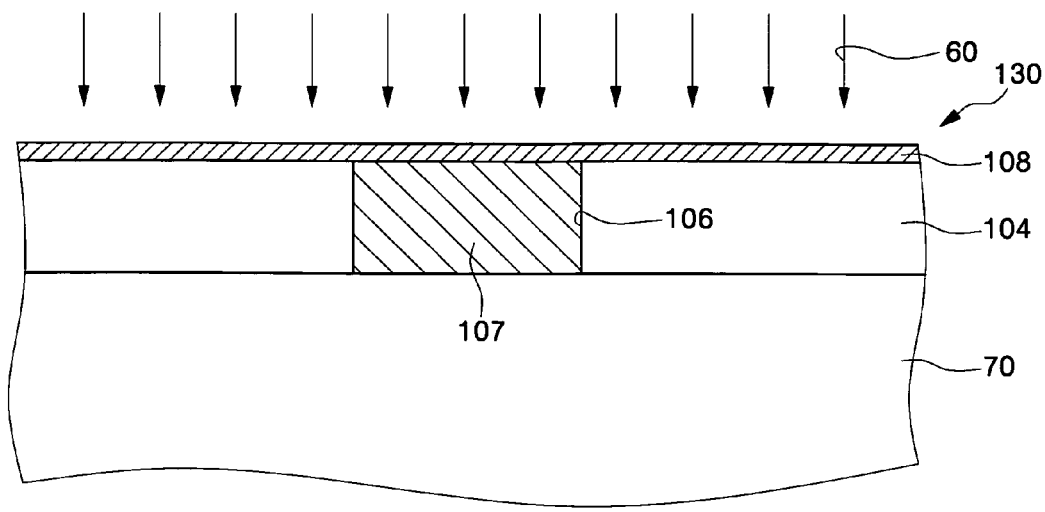
FIGS. 23 and 24 are cross-sectional views illustrating semiconductor devices formed in accordance with embodiments of the invention, each taken along line II-II' of region "D" of FIG. 22.
Figure 24:
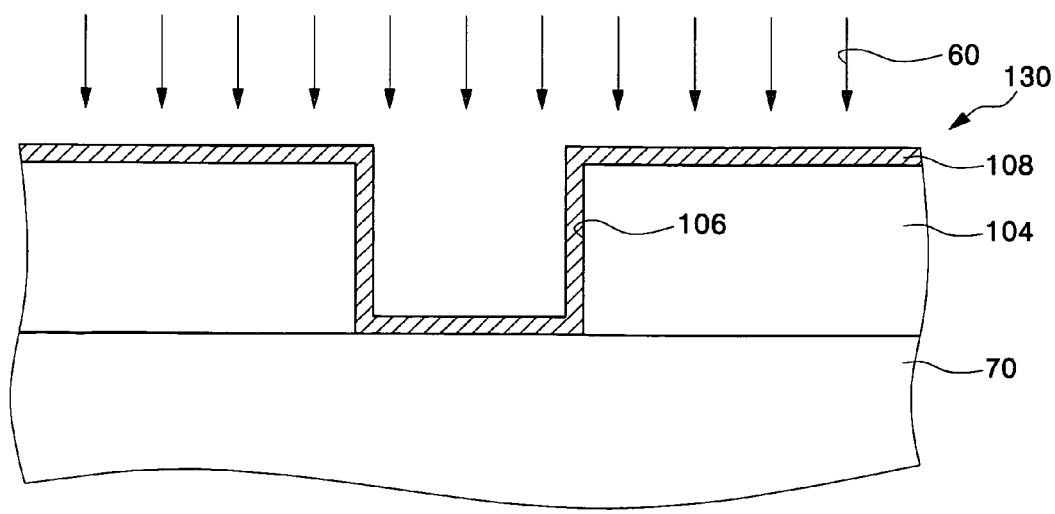
Figure 5:
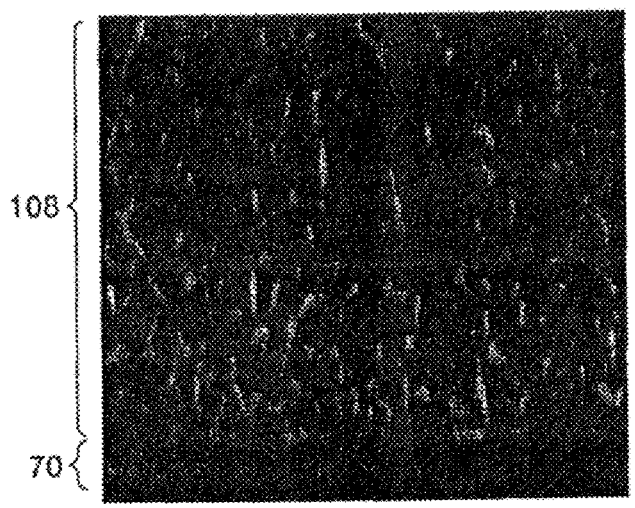
Figure 6:
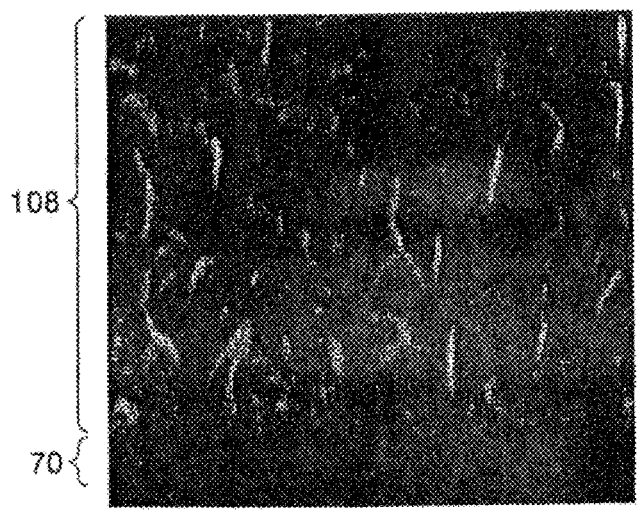
Figure 7:
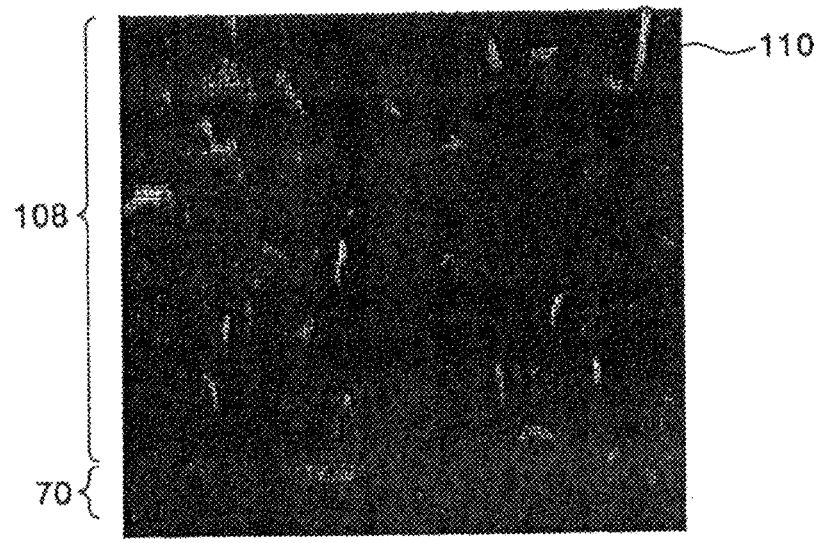
Figure 8:
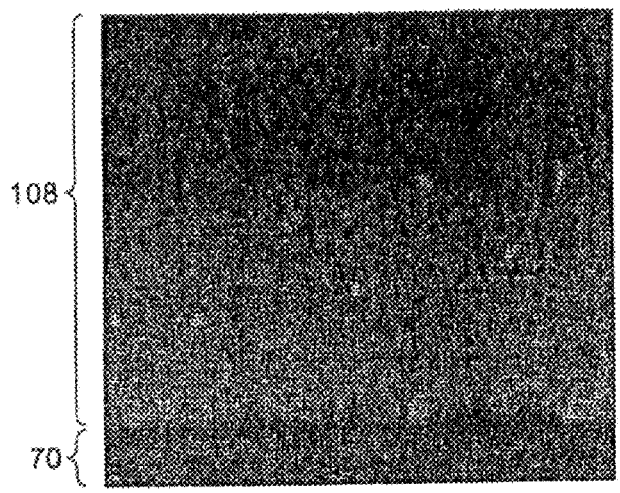
Figure 9:
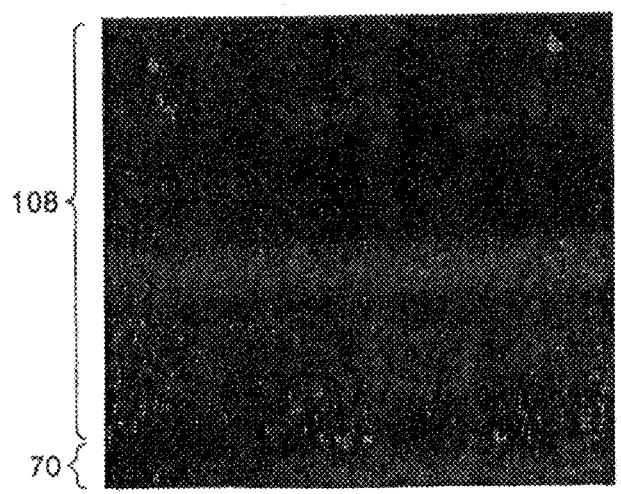
Figure 11:
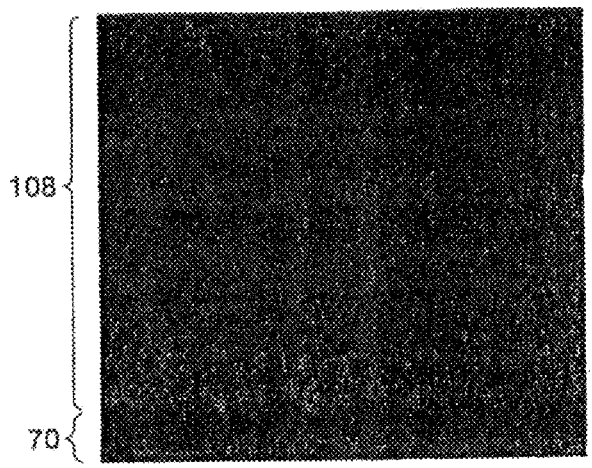
Figure 12:
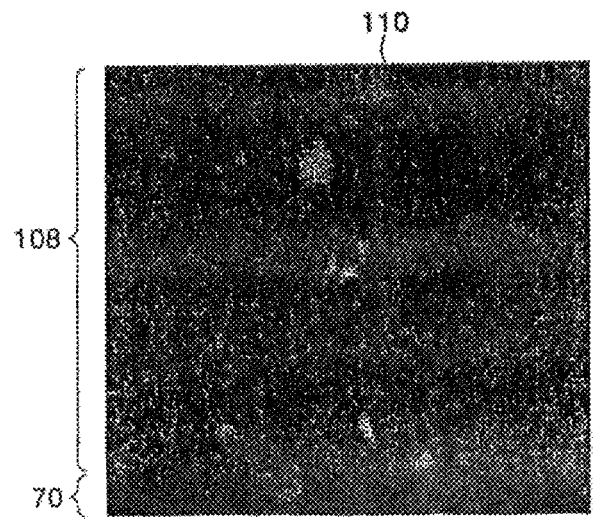
Figure 13:
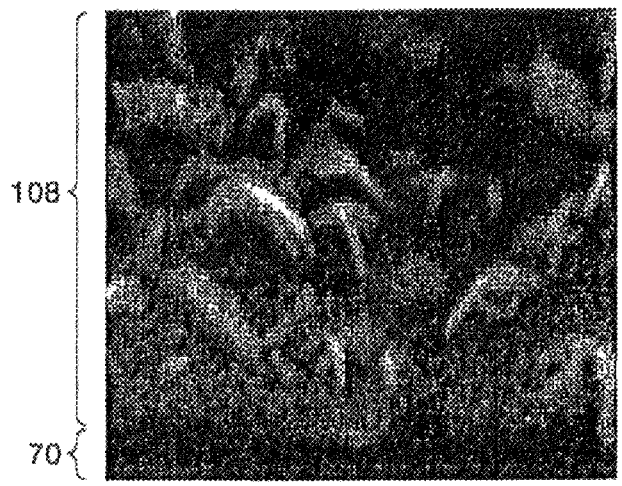
Figure 14:
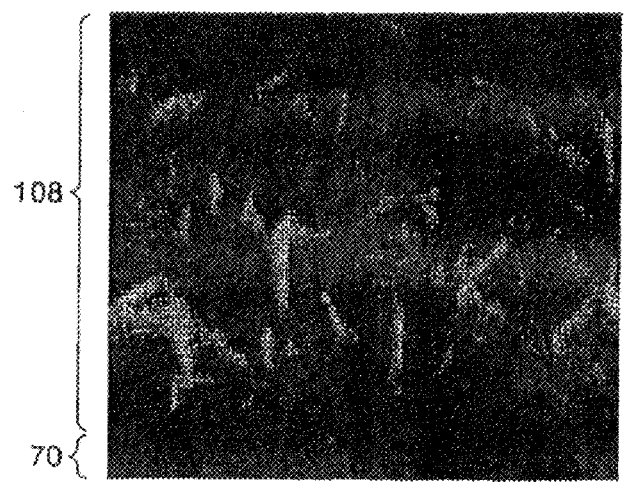
Figure 16:
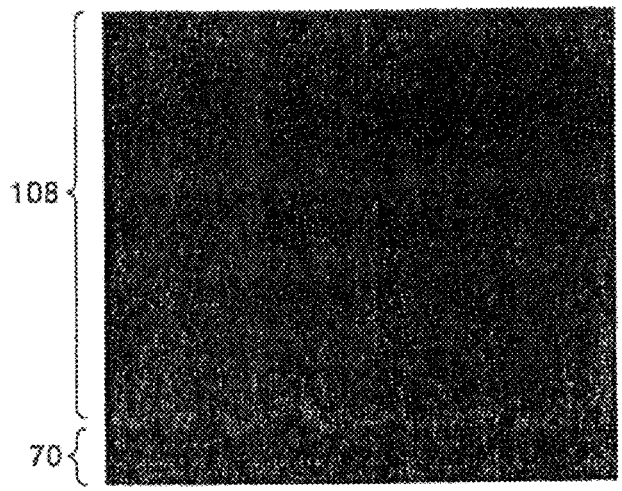
Figure 17:
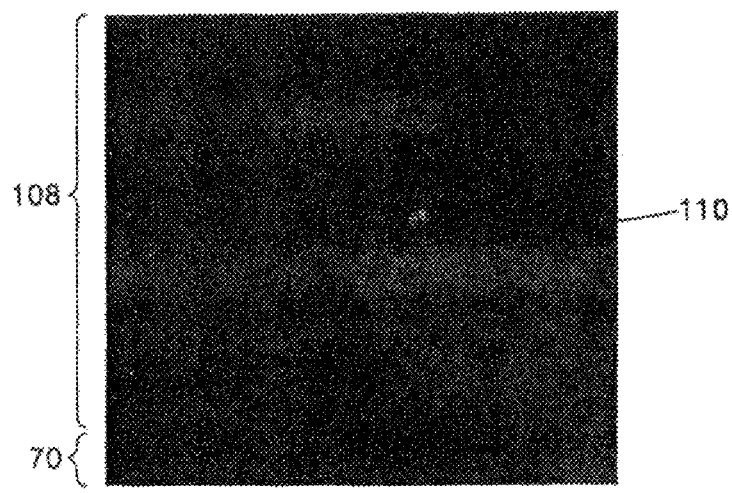
Figure 18:
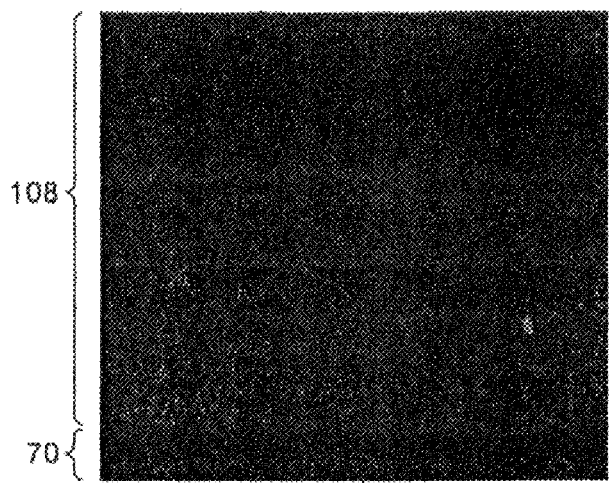
Figure 19:
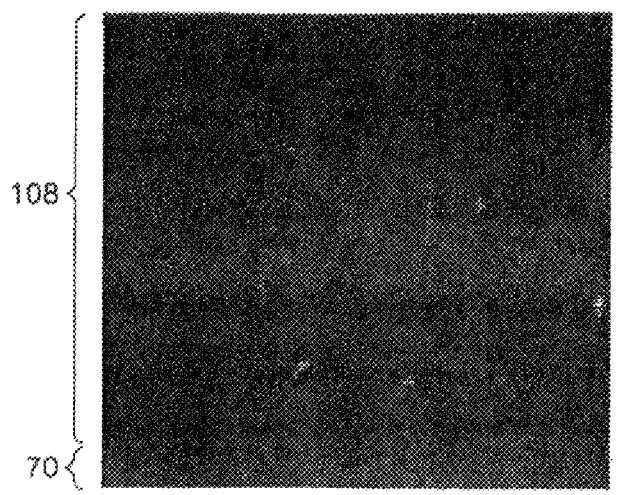
Figure 5:
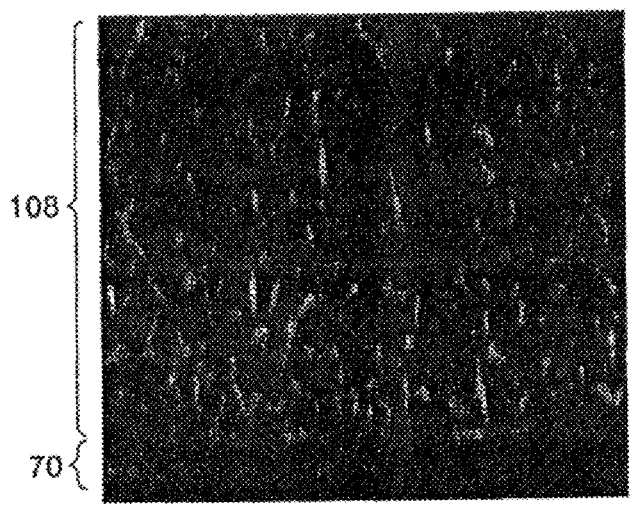
Figure 6:
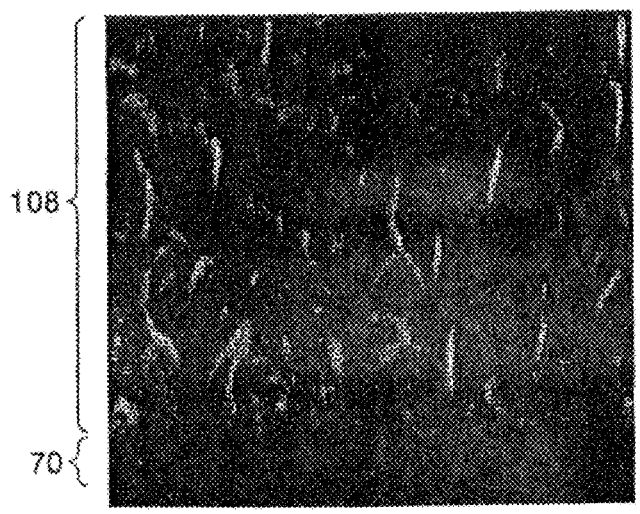
Figure 7:
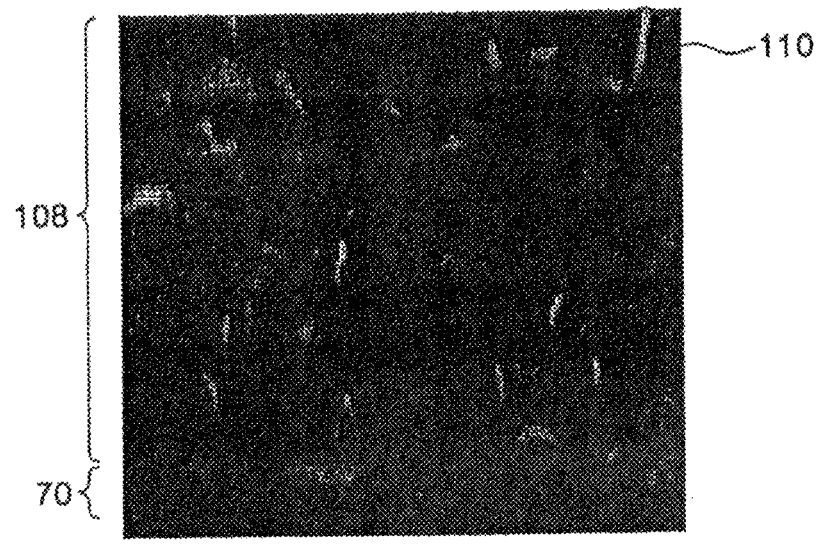
Figure 8:
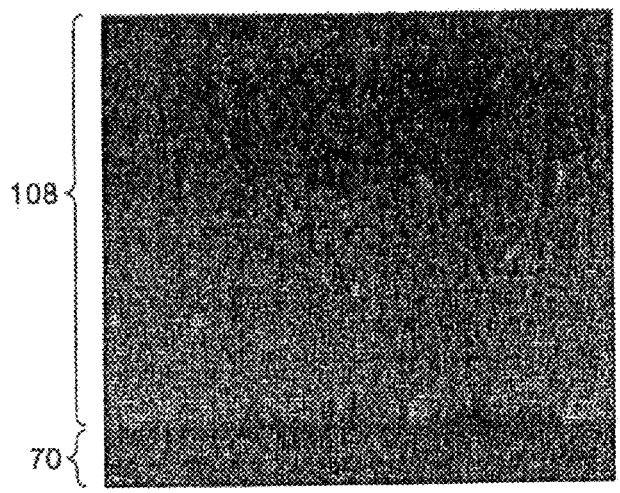
Figure 9:
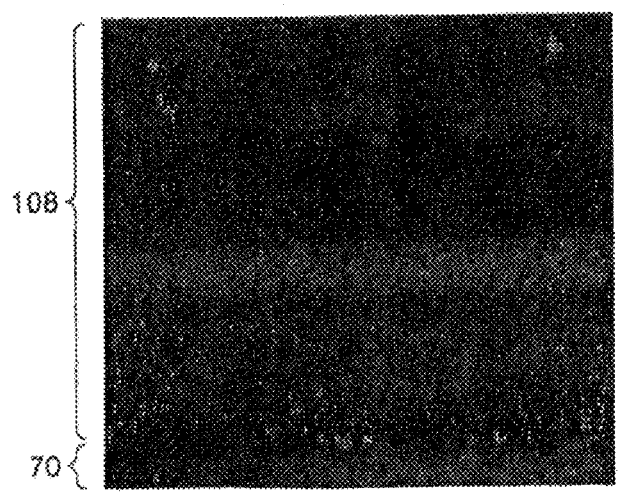
Figure 11:
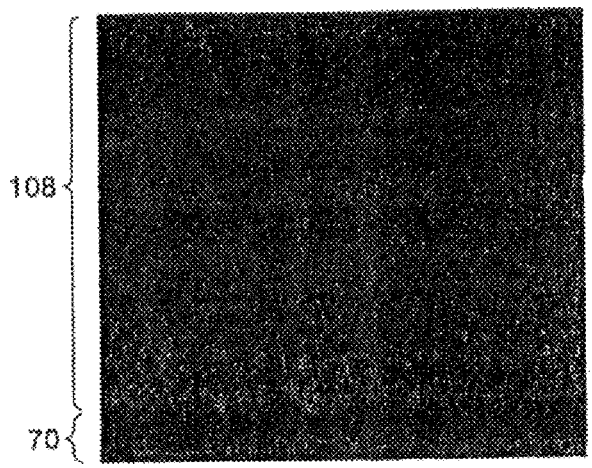
Figure 12:
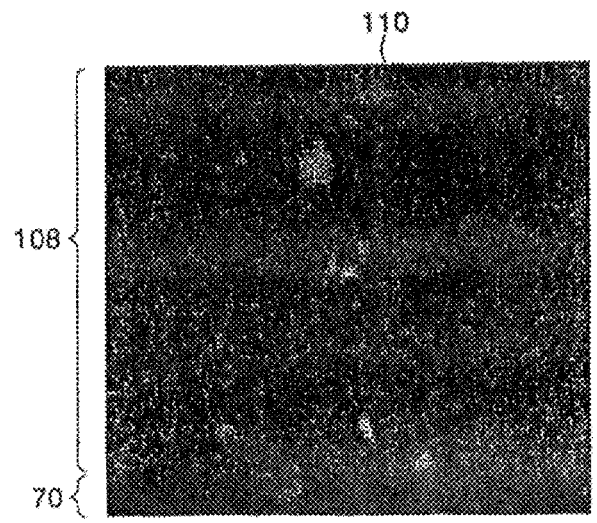
Figure 13:
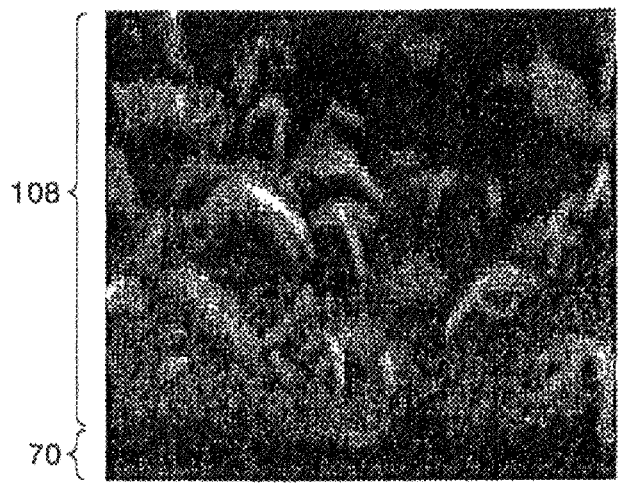
Figure 14:
Figure 16:
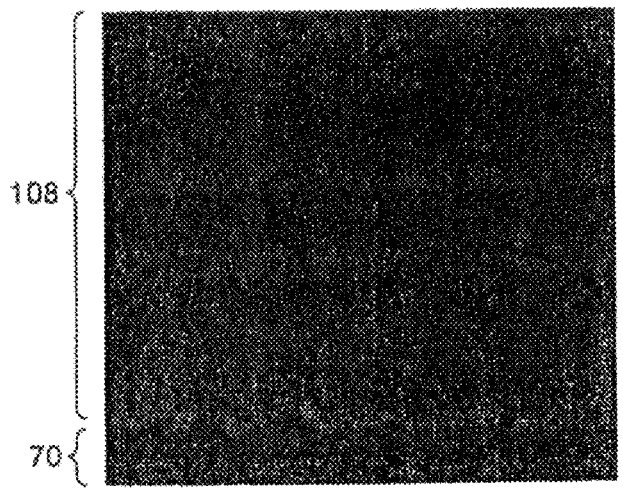
Figure 17:
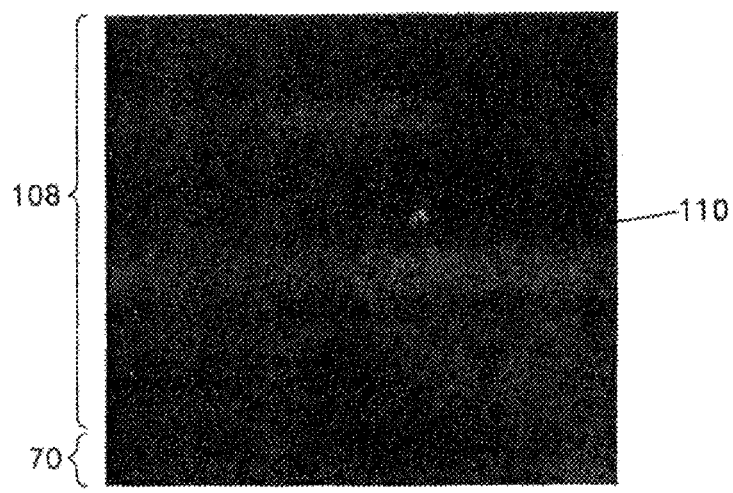
Figure 18:
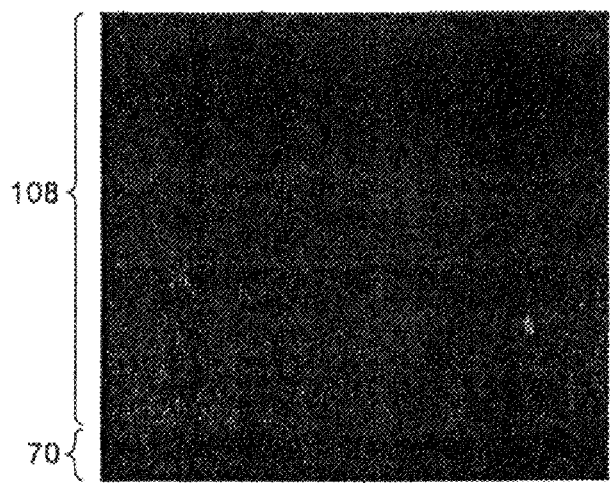
Figure 19:
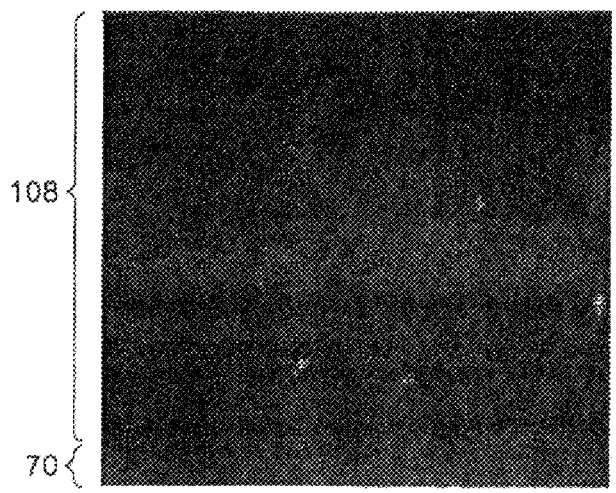

FIG. 22 is a schematic plan view illustrating a semiconductor substrate 70 having an interlayer insulating layer 104 and a metal nitride layer 108 formed thereon according to some embodiments of the invention. FIGS. 23 and 24 are cross-sectional views illustrating semiconductor structures 130, each taken along line II-II' of "D"-region of FIG. 22.

Referring to FIGS. 22 to 24, an interlayer insulating layer 104 may be formed on the semiconductor substrate 70. The interlayer insulating layer 104 may be formed, for example, using an insulating layer containing phosphorus (P) and/or boron (B). A contact hole 106 may be formed in the interlayer insulating layer 104. The contact hole 106 may be formed to expose a portion of the semiconductor substrate 70. As shown in FIG. 23, the contact hole 106 may be filled with a lower conductive electrode node 107. Alternatively or additionally, the contact hole 106 may be formed in the interlayer insulating layer 104 as part of a metallization process.

Referring to FIG. 1, the semiconductor substrate 70 having an interlayer insulating layer 104 formed thereon may be placed in a process chamber 90 (see FIG. 1). The atmosphere of the process chamber 90 may have a pressure of about 0.1 to about 5 mTorr and a temperature of about 200 to about 450° C. The process sources gases 60 may be introduced into the process chamber 90. The process source gases 60 include a metal source gas (e.g., $TiCl_4$) and a nitrogen source gas (e.g. $NH_3$). In some embodiments, the nitrogen source gas may have a partial pressure of about 0.05 Torr in the process chamber 90. In some embodiments, the ratio of the nitrogen source gas flow rate to the metal source gas flow rate in the process chamber 90 is "1" or more. An atmosphere gas may be introduced into the process chamber 90 along with the metal source gas and the nitrogen source gas. The atmosphere gas may facilitate a smooth flow of the metal source gas and the nitrogen source gas in the process chamber 90. The atmosphere gas may include an inert gas such as, for example, argon (Ar). By using the atmosphere gas, the nitrogen source gas and the metal source gas may react with each other to form a titanium nitride layer (TiN) 108 conformally covering the contact hole 106 on the interlayer insulating layer 104.

After formation of the titanium nitride layer 108, a purge gas may be introduced into the process chamber 90. The purge gas may discharge the remaining metal source gases and nitrogen source gases from the process chamber 90. The purge gas may include an inert gas such as, for example, nitrogen ($N_2$). After the introducing of the purge gas, the semiconductor substrate 70 may be post-treated to reduce or eliminate chlorine (Cl) formed in the titanium nitride layer 108. The post treatment may be performed with a plasma formed using nitrogen ($N_2$) and hydrogen ($H_2$). The post treatment may performed with the plasma, which is formed using ammonia ($NH_3$). The post treatment may also formed using the plasma, which is formed using one of $PH_3$ and $B_2H_3$. The resulting titanium nitride layer 108 may have a smooth surface. An exemplary sequence for introducing the process source gases, the atmosphere gas, the purge gas, and the plasma for the post treatment into the process chamber 90 is discussed above with reference to FIG. 2.

In cases where the lower electrode node 107 fills the contact hole 106 in the interlayer insulating layer 104, the titanium nitride layer 108 of FIG. 23 may be used as the lower electrode of a capacitor. The titanium nitride layer 108 may also be used as the upper electrode of a capacitor. When a titanium nitride layer 108 formed in accordance with some embodiments of the invention is used as an electrode of a capacitor, a smooth surface of the nitride layer 108 may minimize leakage currents of volatile semiconductor devices.

As illustrated in FIG. 24, in cases where the contact hole 106 is provided in the interlayer insulating layer 104 as part of a metallization process, the titanium nitride layer 108 may conformally cover the contact hole 106 including sidewalls of the interlayer insulating layer 104 within the contact hole 106 and exposed portions of the substrate 70. Accordingly, the titanium nitride layer 108 may be used as a diffusion barrier in a metallization process. Due to the smooth surface of the titanium nitride layer 108, the metallization process for filling the contact hole 106 may be improved, thereby enhancing the yield of volatile or nonvolatile semiconductor devices formed in the semiconductor substrate 70.

As described above, embodiments of the invention may provide methods of forming a metal nitride layer having a smooth surface by controlling the introduction of process source gases into the process chamber of a deposition system, and the methods of forming semiconductor structures using the same. As such, methods according to some embodiments of the invention may form metal nitride layers having smooth surfaces for use in discrete semiconductor elements to reduce leakage currents.

According to some embodiments of the invention, methods of forming metal nitride layers having a smooth surface include introducing a metal source gas and a nitrogen source gas into a process chamber. The metal source gas may react with the nitrogen source gas to form a metal nitride layer on a semiconductor substrate. The atmosphere in the process chamber may have a pressure of about 0.1 to about 5 mTorr and a temperature of about 200 to about 450° C. The nitrogen source gas may have a partial pressure of about 0.05 Torr in the process chamber, and a ratio of the metal source gas flow rate to the nitrogen source gas flow rate in the process chamber may be "1" or more.

Some embodiments of the invention include forming an interlayer insulating layer on a semiconductor substrate. The semiconductor substrate may be placed in a process chamber of a deposition system. A metal source gas and a nitrogen source gas may be introduced into the process chamber. The nitrogen source gas and the metal source gas may react with each other in the process chamber to form a metal nitride layer on the semiconductor substrate. In some embodiments, an atmosphere in the process chamber may have a pressure of about 0.1 to about 5 mTorr and a temperature of about 200 to about 450° C. The nitrogen source gas may have a partial pressure of about 0.05 Torr in the process chamber, and a ratio of the metal source gas flow rate to the nitrogen source gas flow rate in the process chamber may be "1" or more.

While the invention has been described with reference to exemplary embodiments thereof, it will be understood by those of ordinary skill in the art that various changes in form and details may be made therein without departing from the spirit and scope of the invention as defined by the following claims.

What is claimed:

1. A method of forming a metal nitride layer on a substrate, comprising:
   providing a substrate in a process chamber;
   reacting a metal source gas with a nitrogen source gas in the process chamber at a pressure of about 0.1 mTorr to about 5 mTorr and a temperature of about 200° C. to about 450° C., a ratio of a metal source gas flow rate to a nitrogen source gas flow rate of "1" or more, and a partial pressure of about 0.05 Torr for the nitrogen source gas.

2. The method of claim 1, wherein the metal nitride layer comprises titanium nitride (TiN).

3. The method of claim 1, wherein the nitrogen source gas comprises ammonia ($NH_3$).

4. The method of claim 1, wherein the metal source gas comprises titanium chloride ($TiCl_4$).

5. The method of claim 1, further comprising:
   introducing an atmosphere gas, together with the metal source gas and the nitrogen source gas, into the process chamber.

6. The method of claim 5, wherein the atmosphere gas facilitates a smooth flow of the metal source gas and the nitrogen source gas in the process chamber.

7. The method of claim 5, wherein the atmosphere gas comprises an inert gas.

8. The method of claim 1, further comprising:
   introducing a purge gas into the process chamber after the reacting the metal source gas and the nitrogen source gas.

9. The method of claim 8, wherein the purge gas discharges the metal source gas and the nitrogen source gas from the process chamber.

10. The method of claim 8, wherein the purge gas comprises an inert gas.

11. The method of claim 8, further comprising:
    performing a post treatment of the semiconductor substrate after introducing the purge gas.

12. The method of claim 11, wherein the post treatment reduces chlorine (Cl) formed in the metal nitride layer.

13. The method of claim 11, wherein the post treatment is performed with a plasma formed using nitrogen ($N_2$) and hydrogen ($H_2$).

14. The method of claim 11, wherein the post treatment is performed with a plasma formed using ammonia ($NH_3$), $PH_3$ and/or $B_2H_3$.

15. The method of claim 11, wherein the post treatment is performed in the process chamber.

16. The method of claim 11, wherein the post treatment is performed outside the process chamber.

17. A method of forming a semiconductor device, comprising:
    forming an interlayer insulating layer on a semiconductor substrate;
    placing the semiconductor substrate having the interlayer insulating layer in a process chamber;
    reacting a nitrogen source gas and a metal source gas in the process chamber at a pressure of about 0.1 mTorr to about 5 mTorr and a temperature of about 200° C. to about 450° C., a flow ratio of the metal source gas to the nitrogen source gas of "1" or more, and a partial pressure of about 0.05 Torr for the nitrogen source gas, to thereby form a metal nitride layer on the semiconductor substrate.

18. The method of claim 17, wherein the nitrogen source gas comprises ammonia ($NH_3$).

19. The method of claim 17, wherein the metal source gas comprises titanium tetrachloride ($TiCl_4$).

20. The method of claim 17, wherein the metal nitride layer comprises titanium nitride (TiN).

21. The method of claim 17, further comprising:
    introducing an atmosphere gas, together with the metal source gas and the nitrogen source gas, into the process chamber.

22. The method of claim 21, wherein the atmosphere gas facilitates a smooth flow of the metal source gas and the nitrogen source gas in the process chamber.

23. The method of claim 21, wherein the atmosphere gas comprises an inert gas.

24. The method of claim 17, further comprising:
    introducing a purge gas into the process chamber after forming the metal nitride layer.

25. The method of claim 24, wherein the purge gas discharges the metal source gas and the nitrogen source gas from the process chamber.

26. The method of claim 24, wherein the purge gas comprises an inert gas.

27. The method of claim 24, further comprising:
    performing a post treatment of the semiconductor substrate after introducing the purge gas.

28. The method of claim 27, wherein the post treatment reduces chlorine (Cl) formed in the metal nitride layer.

29. The method of claim 27, wherein the post treatment is performed with a plasma, which is formed using nitrogen ($N_2$) and hydrogen ($H_2$).

30. The method of claim 27, wherein the post treatment is performed with a plasma, which is formed using ammonia, $PH_3$ and/or $B_2H_3$.

31. The method of claim 27, wherein the post treatment is performed in the process chamber.

32. The method of claim 27, wherein the post treatment is performed outside the process chamber.

33. The method of claim 17, further comprising:
    forming a contact hole in the interlayer insulating layer to expose a portion of the semiconductor substrate after forming the interlayer insulating layer; and
    forming an electrode node in the contact hole,
    wherein the metal nitride layer covers the interlayer insulating layer and the electrode node.

34. The method of claim 17, further comprising:
    forming a contact hole in the interlayer insulating layer to expose a portion of the semiconductor substrate after forming the interlayer insulating layer,
    wherein the metal nitride layer is formed on a sidewall of the contact hole and exposed portions of the semiconductor substrate.

* * * * *

UNITED STATES PATENT AND TRADEMARK OFFICE
CERTIFICATE OF CORRECTION

PATENT NO. : 7,300,887 B2 Page 1 of 1
APPLICATION NO. : 11/227542
DATED : November 27, 2007
INVENTOR(S) : Park et al.

It is certified that error appears in the above-identified patent and that said Letters Patent is hereby corrected as shown below:

In the Drawings:

Delete and replace the following drawings with those attached herewith, appearing more clearly: Figs. 5, 6, 7, 8, 9, 11, 12, 13, 14, 16, 17, 18, and 19.

Signed and Sealed this

Ninth Day of December, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,300,887 B2 | |
| APPLICATION NO. | : 11/227542 | |
| DATED | : November 27, 2007 | |
| INVENTOR(S) | : Park et al. | |

It is certified that error appears in the above-identified patent and that said Letters Patent is hereby corrected as shown below:

In the Drawings:

Delete and replace the following drawings with those attached herewith, appearing more clearly: Figs. 5, 6, 7, 8, 9, 11, 12, 13, 14, 16, 17, 18, and 19.

This certificate supersedes the Certificate of Correction issued December 9, 2008.

Signed and Sealed this

Thirtieth Day of December, 2008

JON W. DUDAS
*Director of the United States Patent and Trademark Office*